(12) United States Patent
Ganai et al.

(10) Patent No.: US 7,711,525 B2
(45) Date of Patent: May 4, 2010

(54) EFFICIENT APPROACHES FOR BOUNDED MODEL CHECKING

(75) Inventors: Malay Ganai, Plainsboro, NJ (US);
Lintao Zhang, Princeton, NJ (US);
Aarti Gupta, Princeton, NJ (US);
Zijiang Yang, Plainsboro, NJ (US);
Pranav Ashar, Belle Mead, NJ (US)

(73) Assignee: NEC Corporation, Tokyo (JP)

( * ) Notice: Subject to any disclaimer, the term of this patent is extended or adjusted under 35 U.S.C. 154(b) by 1436 days.

(21) Appl. No.: 10/157,486

(22) Filed: May 30, 2002

(65) Prior Publication Data

US 2003/0225552 A1  Dec. 4, 2003

(51) Int. Cl.
*G06F 17/10* (2006.01)
(52) U.S. Cl. .................... 703/2; 714/4; 714/5
(58) Field of Classification Search .............. 703/2; 716/4, 5; 714/39
See application file for complete search history.

(56) References Cited

U.S. PATENT DOCUMENTS

| | | | |
|---|---|---|---|
| 5,615,137 A * | 3/1997 | Holzmann et al. ............ | 703/17 |
| 6,324,496 B1 | 11/2001 | Alur et al. | |
| 2002/0178424 A1 * | 11/2002 | Gupta et al. ................... | 716/5 |

FOREIGN PATENT DOCUMENTS

| | | |
|---|---|---|
| JP | 10-63537 A | 3/1998 |
| JP | 2001-312530 A | 11/2001 |

OTHER PUBLICATIONS

Edmund Clarke, "Counterexample-Guided Abstraction Refinement", 2003, IEEE, pp. 1-2.*
Randal E. Bryant, "Binary Decision Diagrams and Beyond: Enabling Technologies for Formal Verification", 1995, ARPA, pp. 1-8.*
E. Allen Emerson et al, Modalities for Model Checking: Branching Time Logic Strikes Back, Science of Computer Programming, Jun. 1987, Netherlands, vol. 8, No. 3, 1987, pp. 275-306.
Mary Sheeran et al, "Checking Safety Properties Using Induction and a SAT-Solver", Formal Methods in Computer-Aided Design. Third International Conference, FMCAD 2000. Proceeding, Formal Methods in Computer-Aided Design. Third International Conference, FMCAD 2000. Proceedings, Austin, T, 2000, pp. 108-125.
Matthew W. Moskewicz et al, "Chaff: Engineering an Efficient SAT Solver" Proceedings of the 38th Annual Design Automation Conference. (DAC). Las Vegas, NV, Jun. 18-22, 2001, Proceedings of the Design Automation Conference, New York, NY: ACM, US, vol. Conf. 38, Jun. 18, 2004, pp. 530-535.

(Continued)

*Primary Examiner*—Jason Proctor
(74) *Attorney, Agent, or Firm*—Sughrue Mion, PLLC

(57) ABSTRACT

A method for bounded model checking of arbitrary Linear Time Logic temporal properties. The method comprises translating properties associated with temporal operators F(p), G(p), U(p, q) and X(p) into property checking schemas comprising Boolean satisfiability checks, wherein F represents an eventuality operator, G represents a globally operator, U represents an until operator and X represents a next-time operator. The overall property is checked in a customized manner by repeated invocations of the property checking schemas for F(p), G(p), U(p, q), X(p) operators and standard handling of atomic propositions and Boolean operators.

21 Claims, 11 Drawing Sheets

OTHER PUBLICATIONS

Armin Biere et al, "Symbolic Model Checking without BDDs", Tools and Algorithms for the Construction and Analysis of Systems. 5th International Conference, TACAS'99. Held as Part of the Joint European Conferences on Theory Practice of Software, ETAPS'99. Proceeding, Proceeding of Fifth International Co, pp. 197-207.

Armin Biere et al, "Bounded Model Checking (preprint)"Advances in Computers Preprint of the BMC Article, 'Online! vol. 58, Sep. 2003.

Mary Sheeran et al, "A Tutorial on Stalmarck's Proof Procedure for Propositional Logic", Formal Methods in Computer-Aided Design. Second International Conference, FMCAD'98, Palo Alto, CA, USA Nov. 4-6, 1998, 'Online! pp. 82-99.

Boudewijn R. Haverkort et al, "On the Use of Model Checking Techniques for Dependability Evaluation" Reliable Distributed Systems, 2000. SRDS-2000. Proceedings the 19th IEEE Symposium on Nurnberg, Germany Oct. 16-18, 2000, Los Alamitos, CA, USA, IEEE Comput. Soc., US, Oct. 16, 2000, pp. 228-237.

Chen, H. et al.: "Processing queries with expensive predicates by filtering", Computer Software and Applications Conference, 1999. Compsac '99, Oct. 27, 1999, pp. 350-356.

Tanaka, Takahiro and 2 others: "Implementation of a model checking tool using reachability determination," IEICE Technical Report, Institute of Electronics, Information and Communication Engineers, Apr. 12, 2002, vol. 102, No. 27, pp. 1-6 (CPSY2002-1) (CSDB: Domestic Academic Conference Paper 2004-00438-001).

Ganai, M.K. et al. "Improved SAT-Based Bounded Reachability Analysis," Design Automation Conference, 2002. Proceedings of ASP-DAC 2002: 7th Asia and South Pacific and the 15th International Conference on VLSI Design Proceedings, IEEE, Jan. 1 through 11, 2002, pp. 729-734.

Tsuneo Tanaka and 2 others: "Application examples of the 'Bingo' symbolic model checking system," Fujitsu, Fujitsu Ltd., Nov. 10, 1999, vol. 50, No. 6, pp. 357-361 (CSDB: Enterprise Technical Report 2001-00044-003).

* cited by examiner (a) no loop  (b) (k-l) loop

```
Algorithm imply (vertex, value) {
  assign (vertex, value),
  lvalue = get_value (vertex->left);
  rvalue = get_value (vertex->right);
  next_state = lookup (value, lvalue, rvalue);
  switch (next_state) {
   case CONFLICT:
     return 0;
   case CASE_SPLIT:
     add_vertex(vertex, justification_queue);
     return 1;
    ...
   case PROP_LEFT_AND_RIGHT:
     if (imply (vertex->left, next_state->lvalue) &&
        imply (vertex->right, next_state->rvalue)) {
          return 1;
     }
     return 0;
    ...
  }
  return 1;
}
```

FIG. 3: Circuit-based BCP Procedure

| Current | Next | Action |
|---|---|---|
| 1, X → X | 1, X → X | STOP |
| 0, X → 1 | 0, X → 1 | CONFLICT |
| X, X → 0 | X, X → 0 | CASE_SPLIT |
| 0, X → X | 0, X → 0 | PROP_FORWARD |
| X, X → 1 | 1, 1 → 1 | PROP_LEFT_RIGHT |
| ... | ... | ... |

FIG. 4: 2-Input AND Lookup Table for Fast Implication Propagation

| Logic Formula | pi | gate | BCP Time (sec/million implications) | | | | | |
|---|---|---|---|---|---|---|---|---|
| | | | Hybrid | Chaff | CH | Structure | CS | HS |
| 230U | 5016 | 228346 | 1.154 | 1.589 | 1.37 | 0.9 | 1.76 | 1.28 |
| 252U | 5244 | 242170 | 1.168 | 1.586 | 1.35 | 0.914 | 1.73 | 1.28 |
| 272U | 5244 | 238755 | 1.101 | 1.411 | 1.28 | 0.894 | 1.578 | 1.23 |
| 274S | 3863 | 179217 | 1.11 | 1.52 | 1.369 | 0.908 | 1.67 | 1.22 |
| 275U | 5472 | 255979 | 1.162 | 1.566 | 1.347 | 0.955 | 1.64 | 1.22 |
| 276U | 5472 | 256000 | 1.172 | 1.571 | 1.34 | 0.91 | 1.72 | 1.29 |
| 405U | 6612 | 325069 | 1.236 | 1.605 | 1.29 | 0.92 | 1.74 | 1.34 |
| 406U | 6612 | 325090 | 1.207 | 1.639 | 1.35 | 0.94 | 1.74 | 1.28 |
| 407U | 6612 | 325090 | 1.232 | 1.694 | 1.375 | 0.942 | 1.798 | 1.31 |
| 409U | 6612 | 325090 | 1.245 | 1.639 | 1.316 | 0.923 | 1.775 | 1.35 |
| 435U | 6840 | 338899 | 1.233 | 1.668 | 1.35 | 0.995 | 1.676 | 1.24 |
| 2dlx_100 | 557 | 33848 | 1.82 | 2.22 | 1.21 | 0.931 | 2.38 | 1.95 |

Table 1: BCP Time per million implications

FIG. 5

| Example | pi | gate | Chaff | H | H-jft | Chaff/H | Chaff/H-jft |
|---|---|---|---|---|---|---|---|
| Unsatisfiable Instances ||||||||
| 53U | 6384 | 546779 | 1893.43 | 1629.05 | 639.20 | 1.16 | 2.96 |
| 55U | 6612 | 571185 | 1585.08 | 1402.80 | 715.20 | 1.13 | 2.22 |
| 51U | 6156 | 524116 | 1283.82 | 1010.90 | 508.80 | 1.27 | 2.52 |
| 47U | 5700 | 477047 | 1190.05 | 863.60 | 391.87 | 1.38 | 3.04 |
| 49U | 5928 | 499710 | 1072.64 | 738.30 | 606.70 | 1.45 | 1.77 |
| 435U | 6840 | 338899 | 922.61 | 326.50 | 317.00 | 2.83 | 2.91 |
| 3pipe | 198 | 10810 | 920.50 | 245.60 | 566.90 | 3.75 | 1.62 |
| 45U | 5472 | 452641 | 888.86 | 415.27 | 443.40 | 2.14 | 2.00 |
| 434U | 6840 | 338899 | 880.84 | 532.10 | 318.00 | 1.66 | 2.77 |
| 407U | 6612 | 325090 | 736.49 | 367.20 | 588.00 | 2.01 | 1.25 |
| 438U | 6840 | 338899 | 647.71 | 427.20 | 283.00 | 1.52 | 2.29 |
| 437U | 6840 | 338899 | 621.17 | 281.10 | 419.00 | 2.21 | 1.48 |
| 439U | 6840 | 338899 | 599.14 | 441.80 | 453.00 | 1.36 | 1.32 |
| 436U | 6840 | 338899 | 559.08 | 369.60 | 384.00 | 1.51 | 1.46 |
| 105U | 1017 | 94528 | 547.68 | 248.90 | 506.30 | 2.20 | 1.08 |
| 409U | 6612 | 325090 | 496.31 | 437.20 | 329.00 | 1.14 | 1.51 |
| 406U | 6612 | 325090 | 486.86 | 353.90 | 317.00 | 1.38 | 1.54 |
| 405U | 6612 | 325069 | 471.50 | 585.00 | 445.00 | 0.81 | 1.06 |
| 43U | 5244 | 429978 | 471.13 | 353.87 | 181.25 | 1.33 | 2.60 |
| 109U | 1055 | 101180 | 441.33 | 173.70 | 229.00 | 2.54 | 1.93 |
| 408U | 6612 | 325090 | 433.21 | 358.10 | 347.00 | 1.21 | 1.25 |
| 41U | 5016 | 405572 | 364.03 | 230.27 | 233.80 | 1.58 | 1.56 |
| 39U | 4788 | 382909 | 307.59 | 208.87 | 120.20 | 1.47 | 2.56 |
| 101U | 979 | 88088 | 230.97 | 141.00 | 117.00 | 1.64 | 1.97 |
| 276U | 5472 | 256000 | 193.24 | 132.30 | 104.00 | 1.46 | 1.86 |
| 37U | 4560 | 358503 | 174.47 | 146.96 | 139.12 | 1.19 | 1.25 |
| 252U | 5244 | 242170 | 165.46 | 118.30 | 93.50 | 1.40 | 1.77 |
| 35U | 4332 | 335840 | 165.20 | 128.90 | 76.02 | 1.28 | 2.17 |
| 275U | 5472 | 255979 | 162.97 | 132.10 | 129.00 | 1.23 | 1.26 |
| 230U | 5016 | 228346 | 132.54 | 100.60 | 77.00 | 1.32 | 1.72 |
| 33U | 4104 | 311434 | 98.64 | 80.10 | 42.10 | 1.23 | 2.34 |
| 31U | 3876 | 288771 | 92.22 | 51.30 | 29.30 | 1.80 | 3.15 |
| 2dlx_cc_mc_ex_bp_f_new | 414 | 25075 | 89.07 | 49.30 | 72.40 | 1.81 | 1.23 |
| 272U | 5244 | 238755 | 47.54 | 27.70 | 8.00 | 1.72 | 5.94 |
| Satisfiable Instances ||||||||
| 109S | 2374 | 144590 | 811.12 | 330.4 | 182.5 | 2.45 | 4.44 |
| 105S | 2286 | 134654 | 432.22 | 196.4 | 72.9 | 2.20 | 5.93 |
| 108S | 2367 | 142198 | 423.63 | 766.8 | 138.5 | 0.55 | 3.06 |
| 101S | 2198 | 125070 | 388.35 | 399.38 | 111.9 | 0.97 | 3.47 |
| 102S | 2235 | 127558 | 344.34 | 312.7 | 144.4 | 1.10 | 2.38 |
| 103S | 2242 | 129818 | 343.95 | 481.8 | 86.7 | 0.71 | 3.97 |
| 107S | 2330 | 139578 | 286.1 | 256.4 | 178.2 | 1.12 | 1.61 |
| 104S | 2279 | 132350 | 270.01 | 384.4 | 49.1 | 0.70 | 5.50 |
| 106S | 2323 | 137230 | 226.57 | 198.58 | 94.4 | 1.14 | 2.40 |
| 100S | 2191 | 120305 | 153.41 | 374.8 | 97.8 | 0.41 | 1.57 |
| 2dlx_100 | 557 | 33848 | 120.12 | 76.8 | 17 | 1.56 | 7.07 |

Table 2: Comparison of Total Run Time Between the Hybrid Solver and Chaff

FIG. 6

| Examp | pi | gate | H1 | H2 | H2- | H2- | H2-ft- | H2-ft-fs- | H- | Chaff/H- |
|---|---|---|---|---|---|---|---|---|---|---|
| \multicolumn{11}{c}{Unsatisfiable} ||||||||||
| 53U | 638 | 54677 | 1893.4 | 1629.0 | 1257. | 639. | 1504. | 522. | 81 | 522. | 3.6 |
| 55U | 661 | 57118 | 1585.0 | 1402. | 1558. | 715. | 1427. | 1279. | 1457. | 715. | 2.2 |
| 51U | 615 | 52411 | 1283.8 | 1010. | 945. | 508. | 1145. | 553.0 | 1583. | 508. | 2.5 |
| 47U | 570 | 47704 | 1190.0 | 863. | 490. | 391.8 | 621. | 370. | 907.2 | 370. | 3.2 |
| 49U | 592 | 49971 | 1072.6 | 738. | 685. | 606. | 847. | 545. | 1093. | 545. | 1.9 |
| 435U | 684 | 33889 | 922.6 | 326. | 37 | 31 | 54 | 49 | 36 | 31 | 2.9 |
| 3pipe | 19 | 1081 | 920. | 245. | 369. | 566. | 81. | 25 | 252. | 81. | 11.3 |
| 45U | 547 | 45264 | 888.8 | 415.2 | 490. | 443. | 387. | 193. | 311. | 193. | 4.5 |
| 434U | 684 | 33889 | 880.8 | 532. | 42 | 31 | 47 | 39 | 35 | 31 | 2.7 |
| 407 | 661 | 32509 | 736.4 | 367. | 34 | 58 | 30 | 31 | 33 | 30 | 2.4 |
| 438U | 684 | 33889 | 647.7 | 427. | 35 | 28 | 37 | 54 | 37 | 28. | 2.2 |
| 437U | 684 | 33889 | 621.1 | 281. | 39 | 41 | 32 | 50 | 30 | 281. | 2.2 |
| 439U | 684 | 33889 | 599.1 | 441. | 36 | 45 | 29 | 35 | 37 | 29 | 2.0 |
| 436U | 684 | 33889 | 559.0 | 369. | 43 | 38 | 45 | 40 | 50 | 369. | 1.5 |
| 105U | 101 | 9452 | 547.6 | 248. | 188. | 506. | 758. | 505. | 54 | 188. | 2.9 |
| 409 | 661 | 32509 | 496.3 | 437. | 381. | 32 | 28 | 43 | 50 | 28 | 1.7 |
| 406 | 661 | 32509 | 486.8 | 353. | 33 | 31 | 36 | 33 | 26 | 26 | 1.8 |
| 405 | 661 | 32506 | 471. | 58 | 31 | 44 | 39 | 35 | 47 | 31 | 1.4 |
| 43U | 524 | 42997 | 471.1 | 353.8 | 374. | 181.2 | 374. | 299. | 279.6 | 181.2 | 2.6 |
| 109U | 105 | 10118 | 441.3 | 173. | 138 | 22 | 107 | 437 | 667. | 173. | 2.5 |
| 408 | 661 | 32509 | 433.2 | 358. | 30 | 34 | 22 | 31 | 29 | 22 | 1.9 |
| 41U | 501 | 40557 | 364.0 | 230.2 | 218. | 233. | 264.8 | 153. | 302.3 | 153. | 2.3 |
| 39U | 478 | 38290 | 307.5 | 208.8 | 194. | 120. | 194.0 | 187.3 | 445. | 120. | 2.5 |
| 101U | 97 | 8808 | 230.9 | 14 | 328. | 11 | 198. | 39 | 360. | 11 | 1.9 |
| 276 | 547 | 25600 | 193.2 | 132. | 11 | 10 | 14 | 11 | 11 | 10 | 1.8 |
| 37U | 456 | 35850 | 174.4 | 146.9 | 152. | 139.1 | 183. | 95. | 192. | 95. | 1.8 |
| 252 | 524 | 24217 | 165.4 | 118. | 11 | 93. | 95 | 71 | 77 | 71 | 2.3 |
| 35U | 433 | 33584 | 165. | 128. | 152.0 | 76.0 | 119.0 | 140. | 307. | 76.0 | 2.1 |
| 275 | 547 | 25597 | 162.9 | 132. | 10 | 12 | 93 | 12 | 10 | 93 | 1.7 |
| 230 | 501 | 22834 | 132.5 | 100. | 97 | 77 | 67 | 83 | 76 | 67 | 1.9 |
| 33U | 410 | 31143 | 98.6 | 80. | 81. | 42. | 83. | 61.6 | 65. | 42. | 2.3 |
| 31U | 387 | 28877 | 92.2 | 51. | 61. | 29. | 50. | 24.0 | 58. | 24.0 | 3.8 |
| 2dlx_cc_mc_ex_bp | 41 | 2507 | 89.0 | 49. | 79. | 72. | 68. | 218. | 39 | 49. | 1.8 |
| 272 | 524 | 23875 | 47.5 | 27. | 24 | 8 | 20 | 15 | 16 | 8 | 5.9 |
| \multicolumn{11}{c}{Satisfiable} ||||||||||
| 109S | 237 | 14459 | 811.1 | 330. | 402. | 182. | 394. | 13 | 199. | 13 | 6.1 |
| 105S | 228 | 13465 | 432.2 | 196. | 350. | 72. | 331. | 157. | 130. | 72. | 5.9 |
| 108S | 236 | 14219 | 423.6 | 766. | 208. | 138. | 364. | 183. | 238. | 138. | 3.0 |
| 101S | 219 | 12507 | 388.3 | 399.3 | 206. | 111. | 176. | 105. | 139. | 105. | 3.6 |
| 102S | 223 | 12755 | 344.3 | 312. | 238. | 144. | 156. | 123. | 159. | 123. | 2.7 |
| 103S | 224 | 12981 | 343.9 | 481. | 248. | 86. | 151. | 93. | 132. | 86. | 3.9 |
| 107S | 233 | 13957 | 286. | 256. | 42 | 178. | 162. | 156. | 187. | 156. | 1.8 |
| 104S | 227 | 13235 | 270.0 | 384. | 317. | 49. | 32 | 138.3 | 158. | 49. | 5.5 |
| 106S | 232 | 13723 | 226.5 | 198.5 | 224.0 | 94. | 215. | 132.0 | 175. | 94. | 2.4 |
| 100S | 219 | 12030 | 153.4 | 374. | 204. | 97. | 110. | 175. | 107. | 97. | 1.5 |
| 2dlx_10 | 55 | 3384 | 120.1 | 76. | 80 | 17 | 17 | 4 | 41 | 4 | 30.0 |

Table 3: Details of Circuit-Based Heuristics in the

FIG. 7

| Design-Property | # FFs | # Gates | Options | Bound k | Witness | Time (s) (+Inc) | Time (s) (-Inc) | Mem (MB) |
|---|---|---|---|---|---|---|---|---|
| Bus1-P1 | 1735 | 9467 | op1: -T -C | 18 | No | 6620 | 6709 | 136 |
| | | | op2: -T +C | 20 | Yes | 91 | 99 | 28 |
| | | | op3: +T -C | 20 | Yes | 294 | 326 | 45.5 |
| | | | op4: +T +C | 20 | Yes | 14 | 15 | 10.5 |
| | | | op5: +T +C +H | 20 | Yes | 7 | 8 | 7.1 |
| Bus2-P1 | 1997 | 11043 | op1: -T -C | 18 | No | 4724 | 4754 | 168 |
| | | | op2: -T +C | 23 | Yes | 270 | 379 | 67 |
| | | | op3: +T -C | 23 | Yes | 602 | 733 | 60.7 |
| | | | op4: +T +C | 23 | Yes | 70 | 108 | 21 |
| | | | op5: +T +C +H | 23 | Yes | 36 | 51 | 15 |
| Bus3-P1 | 2259 | 12614 | op1: -T -C | 18 | No | 6369 | 6357 | 205 |
| | | | op2: -T +C | 29 | Yes | 7036 | 7502 | 200 |
| | | | op3: +T -C | 29 | Yes | 2134 | 9874 | 87 |
| | | | op4: +T +C | 29 | Yes | 693 | 3083 | 34.1 |
| | | | op5: +T +C +H | 29 | Yes | 300 | 1894 | 37.5 |
| Bus4-P1 | 2703 | 16670 | op1: -T -C | 18 | No | 9320 | 9402 | 255 |
| | | | op2: -T +C | 18 | No | 1644 | 1657 | 130 |
| | | | op3: +T -C | 18 | No | 1207 | 1540 | 91 |
| | | | op4: +T +C | 18 | No | 170 | 398 | 38 |
| | | | op5: +T +C +H | 18 | No | 87 | 159 | 34 |
| Dma-P1 | 12 | 328 | op1: -T -C | 72 | No | 3880 | 3971 | 11 |
| | | | op2: -T +C | 72 | No | 1969 | 1961 | 9 |
| | | | op3: +T -C | 200 | No | 2 | 3 | 8 |
| | | | op4: +T +C | 200 | No | 1 | 1 | 8 |
| | | | op5: +T +C +H | 200 | No | 6 | 6 | 8 |
| Dma-P2 | 234 | 2495 | op1: -T -C | 20 | No | 3436 | 5718 | 27 |
| | | | op2: -T +C | 20 | No | 811 | 1367 | 19 |
| | | | op3: +T -C | 50 | No | 97 | 578 | 29 |
| | | | op4: +T +C | 50 | No | 37 | 205 | 21 |
| | | | op5: +T +C +H | 50 | No | 28 | 242 | 19 |
| D1-P3 | 256 | 1582 | op1: -T -C | 16 | Yes | 996 | 1010 | 22 |
| | | | op2: -T +C | 16 | Yes | 49 | 55 | 6 |
| | | | op3: +T -C | 16 | Yes | 3 | 3 | 7 |
| | | | op4: +T +C | 16 | Yes | 1 | 1 | 3 |
| | | | op5: +T +C +H | 16 | Yes | 1 | 1 | 2 |
| D1-P4 (S) | 256 | 1582 | op1: -T -C | 24 | Yes | 8808 | 9107 | 42 |
| | | | op2: -T +C | 24 | Yes | 818 | 1076 | 18 |
| | | | op3: +T -C | 24 | Yes | 7 | 8 | 10 |
| | | | op4: +T +C | 24 | Yes | 3 | 5 | 6 |
| | | | op5: +T +C +H | 24 | Yes | 3 | 4 | 5 |
| D1-P5 (S) | 256 | 1582 | op1: -T -C | 25 | No | 8595 | 8668 | 42 |
| | | | op2: -T +C | 25 | No | 688 | 747 | 17 |
| | | | op3: +T -C | 65 | No | 5319 | 11758 | 65 |
| | | | op4: +T +C | 65 | No | 3104 | 9910 | 46 |
| | | | op5: +T +C +H | 65 | No | 4488 | 11865 | 66 |
| D1-P6 (S) | 256 | 1582 | op1: -T -C | 17 | Yes | 1741 | 1809 | 26 |
| | | | op2: -T +C | 17 | Yes | 127 | 164 | 7 |
| | | | op3: +T -C | 17 | Yes | 4 | 5 | 7 |
| | | | op4: +T +C | 17 | Yes | 1 | 1 | 3 |
| | | | op5: +T +C +H | 17 | Yes | 1 | 1 | 3 |
| D1-P7 | 256 | 1582 | op1: -T -C | 17 | Yes | 694 | 725 | 24 |
| | | | op2: -T +C | 17 | Yes | 32 | 37 | 7 |
| | | | op3: +T -C | 17 | Yes | 2 | 2 | 7 |
| | | | op4: +T +C | 17 | Yes | 0 | 0 | 2.8 |
| | | | op5: +T +C +H | 17 | Yes | 0 | 0 | 1.9 |
| D2-P1 | 974 | 10940 | op1: -T -C | 21 | Yes | 653 | 727 | 45 |
| | | | op2: -T +C | 21 | Yes | 8 | 8 | 22.5 |
| | | | op3: +T -C | 21 | Yes | 12 | 11 | 41 |
| | | | op4: +T +C | 21 | Yes | 4 | 4 | 23.5 |
| | | | op5: +T +C +H | 21 | Yes | 3 | 3 | 21 |

Table 4: Results for BMC Verification

FIG. 9

| Design | Property | #FF/ #G | Status | Depth | Time(s) | Mem(MB) |
|---|---|---|---|---|---|---|
| D3 | p1 | 907/5 | T | 2 | 0.09 | 0.76 |
|  | p2 | 317/2345 | T | 0 | 0.06 | 1.01 |
| D4 | p1 | 7/13. | T | 1 | 0 | 0.28 |
|  | p2 | 57/794 | -- | 25 | 24.26 | 17.2 |
|  | p3 | 57/794 | -- | 25 | 24.27 | 17.41 |
|  | p4 | 57/794 | -- | 25 | 26.79 | 17.37 |
|  | p5 | 57/794 | -- | 25 | 24.94 | 17.29 |
|  | p6 | 53/821 | -- | 25 | 36.39 | 18.56 |
|  | p7 | 24/85 | T | 0 | 0 | 0.28 |
|  | p8 | 50/818 | T | 0 | 0.02 | 0.42 |
|  | p9 | 6/10. | T | 0 | 0 | 0.27 |
|  | p10 | 19/55 | T | 0 | 0 | 0.28 |
|  | p11 | 20/61 | T | 0 | 0 | 0.28 |
|  | p12 | 35/509 | T | 0 | 0.01 | 0.34 |
|  | p13 | 53/821 | T | 1 | 0.04 | 0.64 |
|  | p14 | 53/821 | T | 0 | 0.02 | 0.42 |
| D5 | p1 | 2198/20221 | T | 0 | 0 | 2.32 |
|  | p2 | 2198/20223 | T | 1 | 0.3 | 4.45 |
|  | p3 | 2198/20224 | -- | 5 | 7.73 | 29.1 |
|  | p4 | 2198/20021 | T | 0 | 0 | 2.32 |
|  | p5 | 2198/20226 | T | 1 | 0.29 | 6.32 |
|  | p6 | 2198/20035 | T | 0 | 0.05 | 3.21 |
|  | p7 | 2198/20265 | T | 1 | 0.23 | 6.32 |
|  | p8 | 2198/20266 | -- | 5 | 5.87 | 28.6 |
|  | p9 | 2198/20296 | T | 1 | 0.29 | 6.33 |
|  | p10 | 2198/23333 | -- | 5 | 8.93 | 36.3 |
|  | p11 | 2198/20225 | T | 1 | 0.31 | 6.32 |
|  | p12 | 2198/20238 | T | 0 | 0.04 | 3.2 |
|  | p13 | 2198/20226 | T | 1 | 0.3 | 6.32 |
|  | p14 | 2198/20248 | T | 0 | 0.06 | 3.21 |
|  | p15 | 2198/20221 | T | 0 | 0.01 | 2.32 |
|  | p16 | 2198/20538 | -- | 5 | 14.86 | 31.5 |
|  | p23 | 2201/20259 | -- | 5 | 11.63 | 30.9 |

Table 5: Results for Proofs by Induction without Reachability Constraint

FIG. 10

| Design | Property | BDD-based Reachability Analysis | | | | BMC-based Proof by Induction | | | | |
|---|---|---|---|---|---|---|---|---|---|---|
| | | #FF/#G | Time(s) | steps | \|BDD\| | #FF/#G | Status | Depth | Time(s) | Mem(MB) |
| D5 | p3 | 41/462 | 1.6 | 7 | 131 | 2198/14702 | T | 0 | 0.07 | 2.72 |
| | p16 | 115/1005 | 15.3 | 12 | 677 | 2265/16079 | T | 0 | 0.11 | 2.84 |
| | p23 | 63/1001 | 18.8 | 18 | 766 | 2204/16215 | T | 0 | 0.1 | 2.85 |

Table 6: Results for Proofs by Induction using Reachability Constraint

FIG. 11

EFFICIENT APPROACHES FOR BOUNDED MODEL CHECKING

FIELD

This disclosure teaches techniques related to formal verification of digital circuits. Specifically, software, systems and methods for bounded model checking of temporal properties for digital circuits using novel partitioning, incremental learning and inductive proofs based on Boolean Satisfiability and Binary Decision Diagrams are proposed.

BACKGROUND

1. References

The following papers provide useful background information, for which they are incorporated herein by reference in their entirety, and are selectively referred to in the remainder of this disclosure by their accompanying reference numbers in square brackets (i.e., <4> for the fourth numbered paper by R. E. Bryant et al.):

<1> E. M. Clarke, O. Grumberg, and D. Peled, *Model Checking*: MIT Press, 1999.

<2> K. L. McMillan, *Symbolic Model Checking: An Approach to the State Explosion Problem*: Kluwer Academic Publishers, 1993.

<3> A. Biere, A. Cimatti, E. M. Clarke, and Y. Zhu, "Symbolic Model Checking without BDDs," in *Proceedings of Workshop on Tools and Algorithms for Analysis and Construction of Systems (TACAS)*, vol. 1579, *LNCS*, 1999.

<4> R. E. Bryant, "Graph-based algorithms for Boolean function manipulation," *IEEE Transactions on Computers*, vol. C-35(8), pp. 677-691, 1986.

<5> M. Sheeran, S. Singh, and G. Stalmarck, "Checking Safety Properties using Induction and a SAT Solver," in *Proceedings of Conference on Formal Methods in Computer-Aided Design*, 2000.

<9> H. Zhang, "SATO: An efficient propositional prover," in *Proceedings of International Conference on Automated Deduction*, vol. 1249, *LNAI*, 1997, pp. 272-275.

<10> M. Moskewicz, C. Madigan, Y. Zhao, L. Zhang, and S. Malik, "Chaff: Engineering an Efficient SAT Solver," in *Proceedings of Design Automation Conference*, 2001.

<11> P. Bjesse and K. Claessen, "SAT-based verification without state space traversal," in *Proceedings of Conference on Formal Methods in Computer-Aided Design*, 2000.

<12> M. Ganai and A. Aziz, "Improved SAT-based Bounded Reachability Analysis," in *Proceedings of VLSI Design Conference*, 2002.

<13> O. Shtrichman, "Tuning SAT Checkers for Bounded Model Checking," in *Proceedings of International Conference on Computer-Aided Verification*, 2000.

<14> O. Shtrichman, "Pruning Techniques for the SAT-based bounded model checking," in *Proceedings of Workshop on Tools and Algorithms for the Analysis and Construction of Systems (TACAS)*, 2001.

<15> M. Ganai, L. Zhang, P. Ashar, and A. Gupta, "Combining Strengths of Circuit-based and CNF-based Algorithms for a High Performance SAT Solver," NEC USA, CCRL 2001-0079-4-5502-2, December 2001.

<16> A. Biere, A. Cimatti, E. M. Clarke, M. Fujita, and Y. Zhu, "Symbolic model checking using SAT procedures instead of BDDs," in *Proceedings of the Design Automation Conference*, 1999, pp. 317-320.

<17> A. Gupta, Z. Yang, P. Ashar, and A. Gupta, "SAT-based Image Computation with Application in Reachability Analysis," in *Proceedings of Conference on Formal Methods in Computer-Aided Design*, 2000, pp. 354-371.

<18> A. Gupta, A. E. Casavant, P. Ashar, X. G. Liu, A. Mukaiyama, and K. Wakabayashi, "Property-specific testbench generation for guided simulation," in *Proceedings of VLSI Design Conference*, 2002.

<19> J. Kim, J. Whittemore, J. P. M. Silva, and K. Sakallah, "Incremental Boolean Satisfiability and its application to delay fault testing," in *Proceedings of International Workshop on Logic Synthesis*, 1999.

<20> A. Kuehlmann and F. Krohm, "Equivalence Checking using Cuts and Heaps," in *Proceedings of Design Automation Conference*, 1997.

<21> M. Ganai and A. Kuehlmann, "On-the-fly compression of logical circuits," in *Proceedings of International Workshop on Logic Synthesis*, 2000.

<22> A. Kuehlmann, M. Ganai, and V. Paruthi, "Circuit-based Boolean Reasoning," in *Proceedings of Design Automation Conference*, 2001.

<23> P. Goel, "An implicit enumeration algorithm to generate tests for Combinational circuits," *IEEE Transactions on Computers*, vol. C-30, pp. 215-222, 1981.

<24> H. Fujiwara and T. Shimono, "On the Acceleration of Test Generation Algorithms," *IEEE Transactions on Computers*, vol. C-32, pp. 265-272, 1983.

<25> M. Schulz, E. Trischler, and T. Sarfert, "SOCRATES: A highly efficient ATPG System," *IEEE Transactions on Computer-Aided Design of Integrated Circuits and Systems*, vol. 7, pp. 126-137, 1988.

<26> A. Gupta, A. Gupta, Z. Yang, and P. Ashar, "Dynamic detection and removal of inactive clauses in SAT with application in image computation," in *Proceedings of Design Automation Conference*, 2001.

<27> H. Cho, G. D. Hachtel, E. Macii, B. Plessier, and F. Somenzi, "Algorithms for approximate FSM traversal based on state space decomposition," *IEEE Transactions on Computer-Aided Design of Integrated Circuits and Systems*, vol. 15(12), pp. 1465-1478, 1996.

<28> I.-H. Moon, J.-Y. Jang, G. D. Hachtel, F. Somenzi, C. Pixley, and J. Yuan, "Approximate reachability don't-cares for CTL model checking," in *Proceedings of the International Conference on Computer-Aided Design*. San Jose, 1998.

<29> K. Ravi, K. L. McMillan, T. R. Shiple, and F. Somenzi, "Approximation and decomposition of Decision Diagrams," in *Proceedings of the Design Automation Conference*. San Francisco, 1998, pp. 445-450.

2. Introduction a) Model Checking

As hardware design complexity continues to rise, there is a greater need for effective verification methodologies in order to avoid costly errors. Formal verification techniques like symbolic model checking <1, 2> offer the potential of exhaustive coverage and the ability to detect subtle bugs in comparison to traditional techniques like simulation. However, these techniques do not scale very well in practice due to the state explosion problem. A recent alternative is the use of Bounded Model Checking (BMC) <3>. In contrast to symbolic model checking which is typically based on the use of Binary Decision Diagrams (BDDs) <4>, BMC is based on the use of Boolean Satisfiability (SAT) decision procedures. This allows it to handle much larger designs in practice, especially to find bugs when they exist.

In model checking, the hardware design is represented as a finite state machine, and the specification consists of a property expressed in temporal logic. The state space of the design is then exhaustively explored to check if it satisfies the specification. When it doesn't, a counterexample can typically be found, which demonstrates a violation of the correctness property. In bounded model checking, the focus is finding counterexamples (bugs) of a bounded length k. This avoids handling of infinite paths and fixpoint operations, and only paths of a bounded length k need to be considered. Effectively, the problem is translated to a propositional formula such that the formula is true if and only if there exists a counterexample of length k. In practice, the bound k can be increased incrementally to find the shortest counterexample. In addition, a separate reasoning is needed to ensure completeness when no counterexample can be found up to a certain bound <3, 5>.

3. Background to the Technology and Related Work

In this section, we discuss several aspects of related work, including background and conventional technologies for BMC.

The specification is expressed in LTL (Linear Temporal Logic), which includes the following temporal operators—the next time operator X, the eventuality operator F, the globally operator G, and the until operator U. To keep the discussion simple, formulas of the type E f are considered, where E is the existential path quantifier, and f is a temporal formula with no path quantifiers. The design is described as a standard Kripke structure M=(S, I, T, L), with a finite set of states S, the set of initial states I, a transition relation between states T, and a labeling L of states with atomic propositions. Given a Kripke structure M, an LTL formula f, and a bound k, the translation task in BMC is to construct a propositional formula <M, f>$_k$, such that the formula is satisfiable if and only if there exists a witness of length k for the formula f in structure M.

Since the set of states is finite, a symbolic encoding in terms of Boolean variables denoted s is used to represent a state, and a sequence $s_0 \ldots s_k$ is used to represent a finite sequence of length k. The first set of constraints, <M>$_k$, is used to ensure that this sequence is a valid path in M:

$$[M]_k = I(s_0) \wedge \wedge_{t=0}^{t=k-1} T(s_t, s_{t+1})$$

The first part of this formula imposes the constraint that the first state in the sequence should be an initial state I, and the second part of this formula imposes the constraint that every successive pair of states should be related according to the transition relation T. Note that this second part corresponds to an unrolling of the sequential design for k steps, and results in an increasing SAT problem size with increasing k.

The next set of constraints ensures that this valid path in M satisfies the LTL formula f. This involves a case split, depending upon whether or not the path is a (k, l)-loop, as shown in FIG. 2 (from <3>). The case of a loop from state k to state l can be translated as $_lL_k = T(s_k, s_l)$. The case where there is no loop can be translated as $\neg L_k$, where $$L_k = \vee_{l=0}^{l=k} {}_lL_k.$$

Let $[f]_k^0$ denote the translation for formula f in the no loop case, and $_l[f]_k^0$ denote the translation for f in the (k, l)-loop case (detailed definitions are in <3>). Finally, the general translation for the entire problem is given as follows:

$$[M, f]_k = [M]_k \wedge ((\neg L_k \wedge [f]_k^0) \vee (\vee_{l=0}^{l=k} ({}_lL_k \wedge {}_l[f]_k^0)))$$

Here the first conjunct refers to the requirement of a valid path, and the second conjunct refers to it satisfying the specification formula with the case split. For the discussion in this paper, it is important to note that this translation is monolithic, i.e. the entire formula is generated for a given k. This formula is then checked for satisfiability using standard SAT solvers, e.g. SATO <9>, Chaff <10>.

In practice, the search for longer witnesses is conducted by incrementing the bound k. This works well when a witness does exist. However, in case there is no witness, an additional proof technique is needed to conclude that the property is indeed false. In particular, it is sufficient to examine all k up to the diameter of the finite state machine <3>. Use of additional constraints such as loop-free paths, shortest paths etc. have also been proposed in a similar setting for proving safety properties <5, 11>.

Apart from finding bounded-length counterexamples, a BMC engine can also be used for performing proofs by induction <16>. Induction with increasing depth k, and restriction to loop-free paths, provides a complete proof technique for safety properties <5, 11>. Induction with depth k consists of the following two steps:

(a) Base case: to prove that the property holds on every k-length path starting from the initial state.

(b) Inductive step: to prove that if the property holds on a k-length path starting from any state, then it also holds on all its extensions to a (k+1)-length path.

The restriction to loop-free paths imposes the additional constraints that no two states in the paths are identical. Note that the base case includes use of the initial state constraint, but the inductive step does not. Therefore, the inductive step may include unreachable states also. In practice, this may not allow the induction proof to go through without the use of additional constraints, i.e. stronger induction invariants than the property itself. In particular, any circuit constraints known by the designers can be used to strengthen the induction invariants, including reachability constraints.

The above techniques are limited in their ability to operate on circuits with large number of gates and flip-flops. With increasing circuit size, these techniques rapidly become slow and also consume excessive memory.

SUMMARY

The disclosed teachings are aimed at overcoming some of the disadvantages and solving some of the problems in relation to conventional technologies. There is provided a method for bounded model checking of arbitrary Linear Time Logic temporal properties. The method comprises translating properties associated with temporal operators F(p), G(p), U(p, q)

and X(p) into property checking schemas comprising Boolean satisfiability checks, wherein F represents an eventuality operator, G represents a globally operator, U represents an until operator and X represents a next-time operator. The overall property is checked in a customized manner by repeated invocations of the property checking schemas for F(p), G(p), U(p, q), X(p) operators and standard handling of atomic propositions and Boolean operators.

In a specific enhancement, when a choice exists about which operator to check next, the choice is made according to priority determined by degree of difficulty of search.

Even more specifically, the degree of difficulty of search is estimated to be increasing in the following order: atomic propositions, X operator, F operator, U operator, G operator.

In another specific enhancement, a subset of property checking schemas perform a partitioning of a $k^{th}$ instance of a corresponding bounded model checking problem to break up a corresponding Boolean satisfiability problem into multiple smaller Boolean satisfiability subproblems.

Even more specifically, the partitioning is performed across operators, and for each operator both across time frames and within time frames.

Even more specifically the partitioning is targeted, wherever possible, to lead to incrementally related Boolean satisfiability subproblems.

Even more specifically, learning across Boolean satisfiability subproblems is used.

Even more specifically, an incremental formulation of a Boolean satisfiability algorithm is used to learn across related subproblems.

In another specific enhancement, circuit simplification based on constant propagation is used.

In another specific enhancement, circuit simplification based on detection of structural isomorphism is used.

In another specific enhancement, Boolean satisfiability checking problems are solved by using a hybrid SAT solver combining use of circuit-based and CNF-based satisfiability algorithms.

In another specific enhancement, the property checking schema for F(p) comprises starting search from a given start state at time frame i, with a given constraint database, wherein i=0 corresponds to an initial state. The satisfiability of p in the $i^{th}$ state of a current path is checked. If satisfiable, the search is terminated with success. If unsatisfiable, it is learnt that that p is always false in the $i^{th}$ state and this learnt knowledge is added to the constraint database. The search is continued by increasing i until some specified limit, and earlier steps are repeated. The search is terminated inconclusively if specified limit is reached.

In another specific enhancement, completeness is checked.

Even more specifically the checking for completeness further comprises) adding constraints to ensure that the transition out of the $i^{th}$ state does not visit a state seen earlier in the path, and checking satisfiability of the constraint database. If unsatisfiable, the search is terminated with failure. Otherwise search is continued. The steps are repeated until all previous states have been examined.

In another specific enhancement, the property checking schema for G(p) comprises starting search from a given start state at time frame i with a given constraint database, wherein i=0 corresponds to the initial state. A constraint is added to the database to ensure that p is satisfied in the $i^{th}$ state of the current path, and the satisfiability is checked. If unsatisfiable, the search is terminated with failure. if satisfiable, each $j^{th}$ state is checked from start state to $i^{th}$ state whether it is a loopback state and the search is terminated with success if a loopback state is found. Each $j^{th}$ state before the start state is checked whether it is a loopback state and the search is terminated with success if a loopback state is found. The search is continued by increasing i until some specified limit the steps are repeated. The search is terminated inconclusively if specified limit is reached.

In addition, there are several more specific enhancements for the method provided above, that should be clear from the presentation of claims and the detailed description.

Another aspect of the disclosed teachings is a method for inductive proof of safety properties expressed in Linear Time Temporal Logic comprising checking a k-instance base case on a negation of a given property, and checking a k-instance inductive step on a monitor predicate corresponding to the given property, starting from k=0 and increasing it up to a given specified limit, wherein the base case checking further comprises translating the negated property into property checking schemas consisting of Boolean satisfiability checks, associated with temporal operators F(p), and X(p), wherein F represents an eventuality operator, and X represents a next-time operator. A search is performed to find a witness of the negated property, starting from the initial state, by repeated invocations of the property checking schemas for F(p), X(p) operators and standard handling of atomic propositions and Boolean operators. The overall proof is terminated with success if it is proved that a witness cannot be found. The overall proof is terminated with failure if a witness is found in k time frames otherwise when it is inconclusive, the inductive step checking is continued wherein the inductive step checking consists of the following property checking schema. Constraints are added to ensure that the monitor predicate holds for k time frames starting from an arbitrary state, and it does not hold in the $k+1^{st}$ time frame. If unsatisfiable, the overall proof is terminated with success. Otherwise, the search is continued. The search is continued by increasing k up to the specified limit and repeating the base case and inductive step. The proof is inconclusive if the specified limit for k is reached.

Another aspect of the disclosed teachings is a verification engine for verification of circuits wherein the engine is capable of bounded model checking of arbitrary Linear Time Logic temporal properties. The engine comprises a property translator and a property checker. The property translator is adapted to translate properties associated with temporal operators F(p), G(p), U(p, q) and X(p) into property checking schemas comprising Boolean satisfiability checks, wherein F represents an eventuality operator, G represents a globally operator, U represents an until operator and X represents a next-time operator. The property checker is adapted to check an overall property in a customized manner by repeated invocations of the property checking schemas for F(p), G(p), U(p, q), X(p) operators and standard handling of atomic propositions and Boolean operators.

Another aspect of the disclosed teachings is an inductive proof engine for circuits wherein the engine is capable of proving safety properties in Linear Time Logic temporal properties. The engine comprises a base case checker adapted to check a k-instance base case on a negation of a given property. An inductive step checker is provided that is adapted to check a k-instance inductive step on a monitor predicate corresponding to the given property. A property translator is provided that is adapted to translate negated properties into property checking schemas consisting of Boolean satisfiability checks, associated with temporal operators F(p) and X(p), wherein F represents an eventuality operator and X represents a next-time operator; and a searcher is provided that is adapted to search for a witness of the negated property.

Still another aspect of the disclosed teachings is an inductive proof engine for circuits wherein the engine is capable of proving safety properties in Linear Time Logic temporal properties. The engine comprises a base case checker adapted to check a k-instance base case on a negation of a given property. An inductive step checker is provided that is adapted to check a k-instance inductive step on a monitor predicate corresponding to the given property. A property translator is provided that is adapted to translate negated properties into property checking schemas consisting of Boolean satisfiability checks, associated with temporal operators F(p) and X(p), wherein F represents an eventuality operator and X represents a next-time operator. A searcher is provided that is adapted to search for a witness of the negated property.

More specific enhancements for the various specific enhancements are also provided, as should be clear from the claims as well as from the detailed description.

BRIEF DESCRIPTION OF THE DRAWINGS

The above objectives and advantages of the disclosed teachings will become more apparent by describing in detail preferred embodiments thereof with reference to the attached drawings in which:

FIG. 3 shows a pseudo-code for an implementation of a circuit-based BCP procedure FIG. 4 shows a 2-input AND Lookup Table for Fast Implication Propagation.

FIG. 5 shows Table 1 that depicts Boolean Constraint Propagation (BCP) time per million implications.

FIG. 6 shows Table 2 that depicts SAT run times for comparison.

FIG. 7 shows Table 3 that depicts SAT run times a hybrid solver enhances with heuristics.

FIG. 9 shows Table 4 that shows results for BMC Verification.

FIG. 10 shows Table 5 that depicts results of proof by induction examples without reachability constraints.

FIG. 11 shows Table 6 that depicts results for proof by induction examples with reachability constraints.

DETAILED DESCRIPTION

Customized Property Translation

Figure 1:
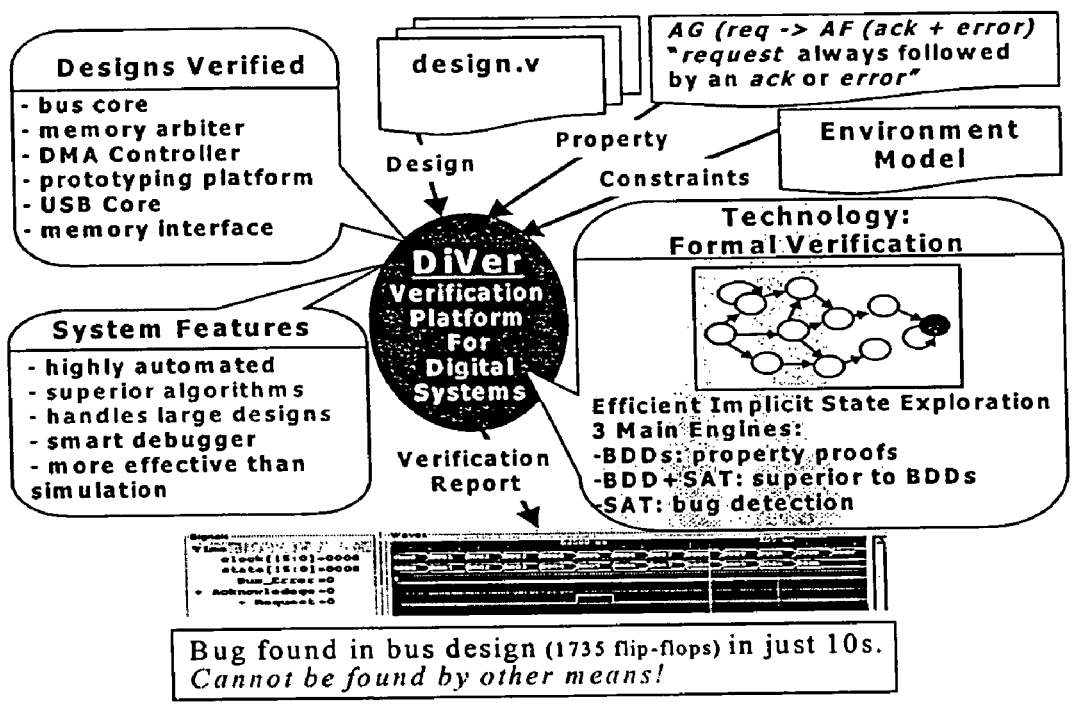
FIG. 1 shows a schematic for a verification platform that depicts the functionalities included in a BMC system.
Figure 2:
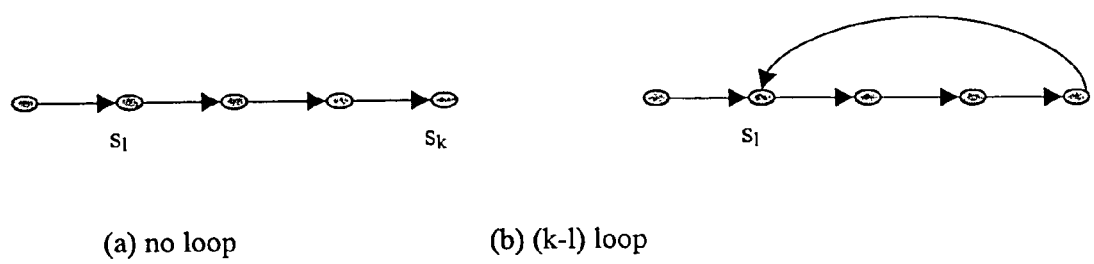
FIG. 2(a)-(b) depicts a case split for a bounded path with no loop and a (k-l) loop.

In this section, the customized translations that form part of the disclosed teachings are described. Rather than generating a monolithic SAT formula, the translation schemas can be viewed as building the formula incrementally, by lazily indexing over the bounded conjunctions/disjunctions, terminating early when possible. Broadly, an incremental formulation is used, employing learning and partitioning to generate multiple simpler SAT subproblems.

Optionally, additional constraints are used to focus only on loop-free path skeletons, i.e. where all states on the path are distinct pair-wise. For safety properties, this has been used to ensure completeness of proofs <5, 11>. In the translation schemas, they are used for liveness properties, which require a witness with a loop. For example, consider the property G(p). Loop-free path skeletons are focussed on where p is true in each state, and all states but the last one on the path are distinct. The last state is identical to the $l^{th}$ state on the path, called the loopback state, to form a (k,l)-loop.

Clearly, any witness for G(p) has a loop-free skeleton, which is found by systematically increasing the bound k. For a given k, the search for a loopback state can start from either the initial or the $k^{th}$ state. If it is found, the property is true. However, if all loop-free skeletons have been examined without finding a loopback state, then the property is false. Recall that the general translation for the G(p) property also considers (k, l)-loops with increasing k. However, it does not constrain the path skeletons to be loop-free. Though loop-free path skeletons do not give as tight a bound as sequential diameter of the design, they do provide a proof capability within the scope of a SAT solver. In contrast, reasoning about the sequential diameter requires a QBF (Quantified Boolean Logic) solver.

Before the details are described, it is useful to classify the different types of constraints that define the SAT subproblems generated by the disclosed translation schemas. They are:

Circuit constraints

Constraints due to the property subformulas

Constraints learned from unsatisfiable SAT instances

Loop-check constraints for considering only loop-free path skeletons

Note that the general translation uses only the first two types of constraints, i.e. circuit and property constraints. Individual use of learned constraints <12>, and loop-check constraints <5>, have been known conventionally, but only in the context of verifying—simple safety properties. Note also that another type of constraints—those arising from conflict clause—are typically generated by the SAT solver itself. By using an incremental formulation, the disclosed translation schemes facilitate the sharing of such constraints also.

To highlight the partitioning, learning, and incremental aspects of the disclosed customized property translations, an exemplary but non-limiting, pseudo code for handling common LTL properties is included herein. Here, p and q denote any Boolean combination of propositional formulas and the X operator, each associated with a node in the circuit graph representation; is_sat(C) denotes a call to the SAT solver, which returns true if and only if the Boolean formula C is satisfiable; L_ij denotes that there is a loop transition between the $i^{th}$ and $j^{th}$ time frames, i.e. L_ij=T($s_i$, $s_j$); and N denotes the maximum depth of unrolling which is under user's control. For ease of description, the circuit constraints are not shown in these translations—they are always added to the SAT subproblems.

As an example, consider the translation of F(p). Note that the outer for-loop on index i (line 13) corresponds to incrementing the bound k for BMC, up to the user-specified maximum limit N. It incrementally builds up the property database C, which is initially true (line 8). For each i, the satisfiability of (C & p_i) is checked (on line 14), i.e. if the current clause database is satisfiable while p is true in the current time frame. If satisfiable, the witness for F(p) is found, and a true is returned. If not, then the fact that p is always false in time frame i is learned and added to the clause database C (line 15). The inner for-loop on index j (lines 16-21) is optional, and is used selectively to perform proofs. It adds pair-wise constraints to C in order to ensure that there is no loop from current state $s_i$ to any previous state $s_j$ on the path. Then a SAT check is made on C (line 21). If C is unsatisfiable, it can be concluded that the property is false because all loop-free paths have been examined without finding p to be true in any time frame. This provides the completeness argument for F(p). On the other hand, if C is satisfiable, there is a way to extend the current path such that it remains loop-free, and another iteration is performed by incrementing loop index i.

As a further optimization, pair-wise loop constraints are added incrementally, as shown in the commented out line 19. This can provide early termination in some cases, without necessarily adding all constraints.

It is also interesting to see how the loop constraints are handled for the property G(p), which requires a witness with a loop. Again, the outer for-loop on i corresponds to incrementing the bound k for BMC. The procedure is started by checking satisfiability of (C & p_i). If it is unsatisfiable, clearly there is no way to satisfy p in the current time frame i, and the G(p) property is false. If it is satisfiable, the constraints are added to check if there is a loop transition from the current state $s_i$ to a previous state $s_j$ on this path. Note that this is checked incrementally (line 35) so that the procedure can be terminated the first time that such a loop is found. However, if such a loop is not found, this fact is learned and added to the clause database C (line 36). After all the loop constraints have been added, a completeness check is made (line 38), which either allows a conclusion that the property is false, or extends the loop-free path skeleton for the next iteration. Pseudo-code for common LTL properties is shown in Appendix 1.

Nested properties like F(p and G(q)) provide the opportunity to partition further into the constituent F and G subformulas allowing learning across the partition. For F(p and G(q)), in particular, an exemplary non-limiting algorithm is as follows: The outer loop on i (line 118) increments the bound k for BMC. The first SAT subproblem is to check (C & p_i). If it is false, then !p_i is learned and added to C (line 120). In this case, if the current path cannot be extended to remain loop-free (lines 124-128), the property is proved to be false. On the other hand, if (C & p_i) is true, the algorithm moves on to checking G(q), starting from time frame i. This check is performed by the function call G(C & p_i, q, i), which looks for a path starting at $s_i$, such that q is true at each state in the path, and the path loops back to a previous state. Note that G(C & p_i, q, i) also checks for a loopback state at time frame j less than i (lines 52-58). In this case, it must additionally prove that q is true at each state until $s_i$. If it is found to be unsatisfiable at any such time frame j, !q_j is learned (line 54). Note the large number of SAT calls made in the process of analyzing this property, and how the databases (C, C', C'') are incremented between successive calls. Each such SAT call that is found to be unsatisfiable provides an opportunity to learn a new constraint. The analysis of such properties is much faster with our approach than with the general translation.

The remaining properties shown in the pseudo-code, as well as other LTL properties that might be found useful, are handled in a similar fashion. The features of the technique include exploiting partitioning, learning, incremental SAT checking, wherever possible. Optionally, loop check constraints can also be added for proof completeness.

1. Extending Scope of Correctness Properties

Not all interesting correctness properties can be expressed in LTL. For example, for one of the production designs, the designers wanted to use the specification AG (p->EX q) to check the feasibility of a certain transition out of a particular state. Though this cannot be expressed as an LTL property, it is possible to handle it within the SAT-based BMC framework.

A more general case of using any bounded number of EX operators (denoted EX:n) is also shown in pseudo-code herein. As a nonlimiting example, consider the first translation (the second translation is similar). It can be used to obtain a counterexample for the property discussed above, since it looks for a witness for the negated property EF (p & !(EX q)).

Note that LTL semantics, where !(EX q) would be the same as EX !q, are not used here. Rather CTL semantics are used, where !(EX q)=AX !q. It is easy to handle n number of X operators by unrolling forward the sequential design for n more steps, and creating a circuit node corresponding to X:n q, denoted q_{n+i}. Pseudo code for common non-LTL properties is shown in Appendix 2.

The procedure checks to see whether p_i is satisfiable (line 4). If it is not, !p_i (line 5) is learnt and i is incremented. If it is satisfiable, the procedure checks whether any such state also satisfies q_{n+i} (line 7). If there is no way to also satisfy q_{n+i}, the witness is deemed to have been found (line 8). On the other hand, if it is satisfiable, those states that satisfy both p_i and q_{n+i} to be excluded from our consideration. This is done by the while loop (lines 11-17). Each iteration of the loop updates the exclusion set C' (initialized to be empty) by adding to it the satisfying state cubes, i.e. states that satisfy both p_i and q_{n+i} (line 16). Next, it is checked if there are any states other than C' that satisfy p_i (line 13). If no such state exists, the procedure has to break from the while loop, and increment i to look for a longer witness (line 14). However, if such a state does exist, it is checked whether it can additionally satisfy q_{n+i} (line 15). If it cannot, a witness is deemed to have been found. Otherwise, the while loop is executed to exclude such states again. For completeness, the procedure can optionally focus on loop-free skeletons only (lines 20-24).

Note that here the SAT solver is being used to incrementally enumerate the solutions for (p_i & q_{n+i}) in the exclusion set. A combination of SAT and BDDs can also be used to compute image sets <17>, and they can be used as constraints within the SAT-based BMC framework.

Another useful CTL property we have encountered is AG(p->EF q), which can be used to check resetability, absence of deadlock etc. Due to the alternation, and the fixpoint nature of the nested EF operator, it is not possible to check this property within the SAT-based BMC framework. However, in practice, designers do have a bound in mind when checking for the eventual reachability of the desired state where q is true. In such cases, the EX:n operator with increasing n, serves as a bounded approximation for the EF operator.

It is possible, in principle, to extend the scope of correctness properties to cover all CTL modalities. The tricky issues are handling alternation, and keeping track of a witness graph, rather than a witness path. In general, this may require use of a QBF solver, or some combination of SAT and BDDs.

2. Incremental SAT Techniques

As described in the previous sections, BMC involves solving a series of SAT instances corresponding to problems with increasing bound k. Several researchers <13, 19> have observed that conflict clauses can be shared between two or more SAT instances with a non-empty intersection between their clause sets, which can lead to an overall reduction in SAT solving time. Specifically, there is considerable overlap of circuit constraints between a k-instance and a k+1-instance of the BMC problem, since they share k unrollings of the transition relation. This has been exploited using a constraint sharing technique which reuses constraints deduced while checking the k-instance of the problem, for speeding up the k+1-instance <13, 14>, thereby leading to a reduction in the overall verification time.

In the exemplary BMC implementation discussed in this disclosure, sharing occurs not just between the circuit constraints due to the unrolled transition relation, but also between the constraints arising from the property translations. Furthermore, multiple SAT problems are generated not only when increasing the bound k, but even within a single k-instance due to use of partitioning in our translation schemas which add constraints incrementally (described in SectionIV A). This focus on constraint sharing across multiple SAT instances leads to a potential reduction in the overall verification time by using incremental SAT techniques.

The basic constraint sharing technique in a SAT solver works as follows <14>. Given two SAT instances S_1 and S 2, conflict clauses that are deduced solely from the set of common clauses Y_0 (i.e., clauses that are in both S_1 and S_2) are identified. Identification is based on first marking the Y_0 clauses. Then, for every conflict clause generated by a conflict analysis, if all clauses leading to the conflict are marked, then the conflict clause is also marked.

In the exemplary implementation, each clause has a bit vector field, called gflag. Each bit of gflag denotes whether the clause belongs to the group corresponding to that bit position. Furthermore, clauses are classified into three types—a constraint clause, a circuit clause, or a conflict clause. A constraint clause belongs to at most one group. A circuit clause does not belong to any group. A conflict clause that is added during conflict analysis becomes a member of a group if there exists any clause leading to the conflict that belongs to that group. Note that conflict clauses derived only from circuit clauses (which include the initial state constraint) can always be reused, though not necessarily replicated.

A small example of using incremental SAT techniques for proving the EF(p) property is shown herein. At the $i^{th}$ time frame, the constraint clause (p_i=1) is added to a new group, gid. (Recall that p_i is property node p at the $i^{th}$ time frame). After an UNSAT result, this clause group gid is deleted, since it will not be reused in later time frames. With this deletion, all conflict clauses and constraint clauses that are members of the group gid are removed. However, conflict clauses that are deduced only from the circuit clauses still remain, and can be shared across the time frames. Furthermore, due to an UNSAT result, we use global learning to add the clause (p_i=0) to the clause group root_gid. Any conflict clause deduced from such globally learned clauses can also be reused in later time frames. Following is a pseudo-code showing the use of Incremental SAT techniques.

```
// N = Max depth
// p_i = property node at i-th time-frame
EF(p)
{
    // allocate a group for learned clauses
    root_gid = alloc_group_id( );
    for(i=0;i<N;i++) {
        // allocate a new group id
        gid = alloc_group_id( );
        // add the (p_i = 1) as constraint clause to
        // the group, gid.
        add_constraint(p_i,gid);
        status = sat_solve( );
        if (status == SAT) return true;
        // delete conflict and constraint clauses
        // that belong to the group gid. Note that
        // conflict clauses derived only from the
        // circuit clauses are never deleted.
        delete_group_id(gid);
        // add the learned clause (p_i=0) to the
        // group root_gid.
        add_constraint(!p_i,root_gid);
    }
}
```

A similar modification is used with translations of other properties as well, in order to exploit incremental SAT techniques for conflict clauses and learned constraint clauses.

3. Circuit Simplification

In the exemplary BMC implementation discussed, circuit simplification techniques are used during pre-processing, as well as during the course of property checking when unrolling the transition relation of the design. The motivation is to simplify the generated SAT problems in order to reduce the overall verification time. Furthermore, circuit simplification techniques were found to be more efficient in handling of constants, in comparison to constant propagation within CNF-based SAT decision procedures. Such constants arise due to initial state and environmental constraints involving constant values on flip-flops, and learned constant constraints added during property checking.

Circuit simplification is achieved by using a non-canonical two-input AND/INVERTER graph representation <20>, and an on-the-fly reduction algorithm <21, 22> on such a graph representation. This graph is used to represent both the design and the Boolean functions computed during symbolic computation across time frames. On the negative side, an AND/INVERTER graph is non-canonical, unlike a BDD which is canonical. However, on the positive side, its size is far less sensitive to any particular function or the variable ordering, and it is often more succinct than a BDD.

The on-the-fly-reduction algorithm is based on an efficient functional hashing scheme for representing such graphs. Similar to BDDs, a hash table is used to remove structural redundancy during construction. Further, a structural two-level lookup scheme is applied that converts any local four-input sub-structure into a canonical representation, effectively removing local redundancy. If the local two-level lookup does not apply, simple rewriting is used to further reduce the circuit graph (details are available <22>). Effectively, this identifies a large number of isomorphic substructures and maps them onto the same subgraph, thereby achieving significant compression of the graph. Intuitively, this simplified graph reduces the search space for a SAT-solver and hence, is more efficient for Boolean reasoning. As shown in its application to bounded reachability analysis <12>, the computational advantage gained by SAT due to such simplification is significant.

4. Hybrid SAT Solver

A hybrid SAT solver is used in the disclosed exemplary BMC engine. It employs state-of-art innovations in decision variable selection, BCP and backtracking, while processing the original logic formula in circuit form, and learned conflict clauses in CNF, respectively. In particular, important differences in key steps of the circuit-based and CNF-based approaches for SAT are discussed as well as how benefits are realized from both in the hybrid approach.

a) State-of-Art in Circuit-Based BCP BCP is found to be a part of a SAT solver that constitutes about 80% of the total time in many instances. Therefore, any improvement in BCP significantly benefits the overall performance of a SAT solver.

Existing circuit-based Boolean reasoning implementations <22-25> use a representation based on AND and OR gate vertices with INVERTERs either as separate vertices or as attributes on the gate inputs. Constant propagation across AND and OR gates is, of course, well known, but the speed tends to be very implementation dependent. As an example, <22> uses a lookup table for fast implication propagation. Based on the current values of the inputs and output of the vertex, the lookup table determines the next "state" of the gate where the state encapsulates any implied values and the next action to be taken for the vertex. The algorithm imply from <22> shown in FIG. 3 for a generic vertex type iterates over the circuit graph.

For each vertex, it determines new implied values and the direction for further processing. FIG. 4 (from <22>) gives some cases from the implication lookup table for a two-input AND gate as an example. For Boolean logic, only one case, a logical 0 at the output of an AND vertex, requires a new case split to be scheduled in the justification_queue. All other cases either cause a conflict, in which case the algorithm returns for backtracking, or further implications, or a return to process the next element from the justification_queue. Due to its low overhead, this implication algorithm is highly efficient. As an indication, on a 750 MHz Intel PIII with 256 MB, it can execute over one million implications per second.

1. Comparison with CNF-Based BCP

The CNF-based BCP in Chaff <10> relies on 2-literal watching and lazy-update for efficiency. This approach has a clear advantage when clauses are large since unnecessary traversal of such clauses is avoided. To reduce overhead, this approach does not keep track of the clauses that have been satisfied. However, there is an inherent cost associated with visiting the satisfied clauses. Specifically, even if a clause gets satisfied due to an assignment to some un-watched literal, this approach will still update the watched literal pointers. In addition, there is an inherent overhead built into the translation of gates into clauses. Each two-input gate translates to three clauses, while in the circuit-based approach a gate is a monolithic entity. Therefore, in the circuit approach an implication across a gate requires a single look up in the table of FIG. 4 while in the CNF approach it requires processing multiple clauses.

For the generally small clauses arising from circuit gates it is found that these differences translate to significant differences in BCP time. As is shown in the next section, BCP on a gate representation is consistently and significantly faster than BCP in a state-of-art CNF based solver like Chaff.

b) Effect of Conflict-Based Learning Motivates the Hybrid Approach

When clauses are large on the other hand, as in the case of conflict-based learnt clauses, adding them as a gate tree for circuit-based BCP can lead to an excessively large learned structure. Addition of such gate tree results in a significant increase in the size of the circuit. This in turn, increases the number of implications, and thereby, negates the gains obtained from BCP on the circuit structure. For such clauses, it is more appropriate to maintain them as monolithic clauses and take advantage of CNF-based 2-literal watching and lazy update to process them efficiently.

Based on these observations, a hybrid approach is contemplated where the circuit-based logic expressions are maintained using the uniform-gate data structure, the learnt clauses as CNF and processed separately as appropriate.

c) BCP Results

The times presented in Table 1 (shown in FIG. 5) are the BCP times in seconds per million implications on a 750 MHz Intel PIII with 256 MB. The examples used are large logic formulas derived from the BMC application on a large industrial circuit. The times are for the hybrid and CNF approaches for exactly the same logic formula in the columns Hybrid and Chaff. The BCP time includes the time for BCP on learnt clauses added during the SAT process as well as the original gate clauses. The size of the formula in terms of the number of primary inputs and gates is indicated in the columns pi and gate. The column CH is the ratio between the CNF and hybrid BCP times. It is clear that the hybrid approach is consistently faster than the CNF-based approach in Chaff on these large formulas.

To demonstrate the overhead of BCP on learnt clauses, the BCP time per million implications is also presented with the circuit-based method on just the gate clauses in the same formulas. This is shown in the column Structure. The column CS (HS) is the ratio between the Chaff (Hybrid) time and the Structure time. These columns (CS and HS) allow us to compare the BCP time for just the gate clauses with the BCP time for the gate and learnt clauses. Clearly, large learnt clauses introduce a significant overhead on BCP time.

d) Overall Hybrid SAT Solver

Demonstrating a faster BCP is only the partial story. It must also be demonstrated that the entire SAT process runs faster with the hybrid approach. Once a hybrid approach is used, a number of new circuit-based heuristics and advantages opened up that are unavailable in the pure CNF approach. In this section the benefits derived from them are discussed. The SAT run times are presented in Table 2 (shown in FIG. 6) for this comparison. The times are on a 750 MHz Intel PIII with 256 MB. The logic formulas are derived from the application of BMC on three large industrial circuits (bus, arbiter, and controller) and some public domain benchmarks <26>. In order not to pollute the results, we ran the hybrid approach on more than 70 logic formulas, but report results only on those requiring more than 40 s of CPU time. The formulas are distributed between unsatisfiable and satisfiable instances. The size of the formula can be determined from the pi and gate columns indicating the number of primary inputs and gates.

e) Comparison of Chaff and Hybrid for Identical Heuristics

The first comparison is between the hybrid solver and Chaff for exactly the same heuristics, i.e., apart from the BCP differences, the two use identical algorithms for order of processing of implications, conflict-based learning, backtracking and decision variable selection. In spite of the same heuristics, a minor difference does creep in due to uncontrolled choice of the conflict node when several nodes are in conflict. This difference has a very little effect in unsatisfiable instances since the entire search space must always be traversed, but may have a pronounced effect in satisfiable instances for which one of the two solvers may happen to get lucky in hitting upon a solution early. With this in mind, only the unsatisfiable instances should be considered as reasonable data for this controlled experiment. The columns Chaff and H indicate the times for the Chaff and hybrid solvers in Table 2. It is clear that the overall performance of the hybrid solver is much better than Chaff. The typical ratio of Chaff time to Hybrid time is greater than 1.3 with the maximum being 3.75. The ratio of the total time spent in Chaff to the total time spent in the hybrid solver for all the unsatisfiable instances is 1.48. As expected, for the satisfiable instances shown in Table 2, Chaff to Hybrid ratio (Chaff/H) is distributed evenly on either side of 1.0 with a large standard deviation.

5. Circuit-Based SAT Heuristics

In this section details of the circuit-based heuristics used to enhance the hybrid solver are presented. Please consider Table 3 (shown in FIG. 7) for the purpose. The same examples as in Table 2 are used here. The column H1 shows the run time for the hybrid solver with the same heuristics as in Chaff, as described in the previous section.

a) Order of Following Implications

Chaff uses a FIFO mechanism to follow implications—basically the implications are processed in the order in which they are generated. With the knowledge of gate fanouts and directionality in the hybrid approach, it is possible to follow implications based on circuit paths. It is found that an approach in which the implications generated from gates are followed in FIFO manner, while the implications generated from the learnt clauses are followed in a path-based manner works very well. The column H2 indicates the total run time using this heuristic. It is clear that the heuristic generates a speed up over H1 for almost all (14 out of 18) the examples. All the columns to the right of H2 use this heuristic.

b) Branch-Variable Decision Strategy

The decision strategy involves picking an unassigned variable and value to branch on. Several strategies have been suggested but none has been a clear winner. The most successful have been based on some form of dynamic literal count. How circuit information can be used to enhance this basic mechanism, is discussed herein.

Figure 8:
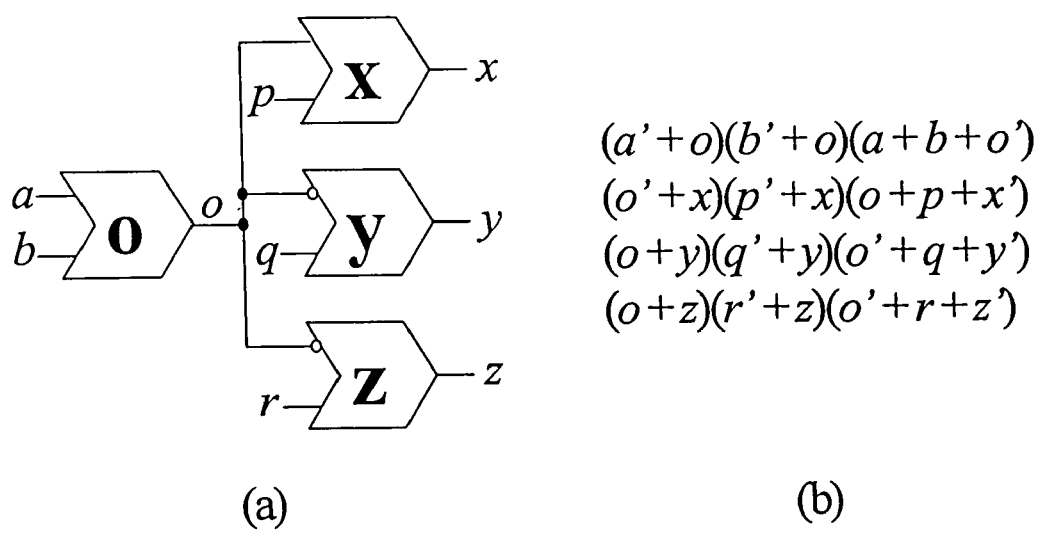
FIG. 8 (a)-(b) shows an example of counting literals in clauses.

It has been observed that a CNF based solver counts the number of positive and negative literals in clauses so that it may choose a literal that satisfies the largest number of clauses. What is really the issue is to obtain consistent values at the inputs and output of each gate. Counting literals in clauses does not address that as shown in FIG. 8. The OR gate o has inputs a and b, and fanout gates x, y, and z, as shown in FIG. 8(a). The clauses generated are shown in FIG. 8(b). One can see that when a variable is an input, its positive and negative literal counts in the clauses cancel out. When it is an output of a gate, its positive literal count is always one more than the negative literal count. The corresponding scores in FIG. 8(b) are 5 and 4, respectively. In short, the literal count actually does not provide any useful information for clauses generated from gates. With the gate fanout information, on the other hand, one can accurately determine the number of positive and negative fanouts of a gate for decision-making. This is called fanout heuristic. The column H2-fs indicates the SAT time with this heuristic. While this heuristic is not a clear winner, it does give better results than the original hybrid approach (H2) in a slight majority (26/45) of examples.

Clauses that do not determine the satisfaction of the formula are termed inactive clauses <27>. These clauses arise from gates that become unobservable. Processing of these clauses and decisions on variables in these clauses is basically wasted effort. Dynamic detection and removal of these clauses requires repeated marking and unmarking of these clauses. Even though these run time operations lead to a pruned search space, the repeated marking and unmarking leads to a loss in the overall performance. Note that this performance improvement is shown only in reachability analysis. In a propagation-justification type of Boolean reasoning mechanism operating on a circuit <24>, dynamic detection of unobservable gates and inactive regions happens automatically. The variables that need to be justified are called frontier variables. This strategy is applied by restricting the variable decisions to only those unassigned gates on the dynamically changing frontier. This is called frontier heuristic. This heuristic also has the benefit of leading to a satisfying assignment faster when it exists. The column H2-ft indicates the SAT time with this heuristic. Better results than the original hybrid approach (H2) are obtained in 80% of the examples.

The run time with the frontier and fanout heuristics both in use is shown in column H2-ft-fs. Again, a speed up is observed over H2 in about 73% of the examples.

c) Learning XOR/XNOR Gates

Circuits with large numbers of XOR and XNOR gates are known to degrade the performance of SAT solvers. Given the uniform-gate circuit representation, it is possible and efficient to extract XOR and XNOR gates in the circuit. In the hybrid representation, clauses for these XOR/XNOR gates are learnt and added to the CNF clause database. The run time with this learning applied in conjunction with the frontier and fanout heuristics is shown in column H2-ft-fs-slx. With all the three heuristics in place, a speed up is observed over the basic hybrid approach (H2) in more than 62% of the examples.

d) Best Results with the Hybrid Solver

The best results obtained with the hybrid solver are shown in column H-best. It is clear that the hybrid solver is faster than Chaff in all the examples. The ratio of the Chaff time to the best hybrid solver time is shown in the column Chaff/H-best. The speed up is greater than 50% in all of the examples and greater than 2 in 69% of the examples. The heuristics in Table 3 are clearly immature and require further study. It is clear, though, that the H2-ft heuristic works fairly well and could be used as by default.

e) Implications on Bounded Model Checking

SAT is a core engine in applications like BMC. In fact, it can be expected that in a typical BMC run requiring analysis of the circuit for 50-100 time frames the SAT solver would be called thousands of times. With the SAT solver consuming on the order of a few minutes per call, it is typical for a long BMC run to last for multiple days. A speed up by a factor of two in the core engine, therefore, can prove to be very significant since it would lead to a very large absolute run time saving. Another aspect of this works is that it demonstrates clearly that circuit SAT techniques are competitive and superior to CNF based techniques. The practical effect is that it is unnecessary to incur the overhead of copying the entire circuit into a CNF data structure for the purpose of SAT. This has the benefit of almost halving the memory requirement of these applications, allowing them to scale to larger circuits, or in the case of BMC, also to larger number of time frames.

6. Experimental Results for Production Designs

An implementation of BMC engine has been applied in DiVer for verification of some production designs. Each verification task consisted of searching for a witness (or a counterexample) for the desired property. The properties included both safety and liveness. The results are summarized in Table 4 (shown in FIG. 9). Most experiments were performed on a 750 MHz Intel PIII with 256 MB. Some experiments, indicated by "(S)" in the table, were performed on a Sun UltraSparc 440 MHz, 1 GB workstation.

For each design, experiments are conducted for five different sets of options, listed in Column 4. The first four sets relate to the four different combinations of customized translations (denoted +/−T) and circuit simplification using structural isomorphism (denoted +/−C). (Circuit simplification resulting from propagation of constants is always used as a default.) The first set op1 uses neither, the second set opt uses only circuit simplification, the third set op3 uses only customized translations, while the fourth set op4 uses both. All four sets use a modified version of the Chaff SAT solver <10>, which is capable of using incremental SAT techniques described in Section 6. Finally, the fifth set op5 also uses customized translations and circuit simplification, i.e. the same options as the fourth set, but with a Hybrid SAT solver (denoted +H), as described in Sections 8 and 9.

It is also interesting to examine how much of the potential performance gain might be due to use of incremental SAT techniques. Therefore, experiments were conducted for all five sets of options, with and without use of incremental SAT techniques in the SAT solver. Note that the customized translations always use an incremental formulation, whether or not the SAT solver uses incremental SAT techniques.

In Table 4, the results are shown for all five sets of options (marked 1 through 5) for some designs and properties. The second and third columns report the number of flip-flops and number of gates, respectively, in the static cone of influence for each property (same for all sets). The fifth column reports the number of time frames unrolled to find the witness/counterexample, i.e. the parameter k for BMC, while the sixth column reports whether or not a witness was found for that k. The next two columns report the time taken (in seconds) with and without the use of incremental SAT techniques, denoted +Inc and −Inc, respectively. The last column reports the memory required (in Mbytes) for performing the verification with incremental SAT techniques. (The memory used by the verification without incremental SAT was about the same, for most examples.)

The effectiveness of the disclosed enhancements can be seen clearly from the consistent performance improvements of option sets 2 through 5, in comparison to basic BMC (option set 1). The bigger examples show a performance improvement of up to two orders of magnitude for the same bound k. Note that in many cases, basic BMC could not complete as many time frames as BMC with enhancements within the allotted time (10 k seconds). In particular, it was not successful in finding a witness for the Bus examples.

Among the enhancements, the use of only customized translations (op3) gave better performance than use of only circuit simplification (op2) for most examples. However, the combination of using both (op4) is always better than using only one or the other. Finally, use of the Hybrid SAT solver (op5) enhances this performance in most examples.

In terms of use of incremental SAT techniques, note that the gains in using incremental SAT techniques are the lowest with basic BMC (op1), where only circuits constraints are shared across different k-instances of BMC. The real benefit of incremental SAT is demonstrated by our customized translations, which offer additional opportunities for sharing constraints within each k-instance of BMC as well. Therefore, the improvement factors are generally greater with use of customized translations (op3, op4, op5) than without (op1, op2). This can be seen clearly for the bigger examples —Bus3, Dma2, and D1-P5—where the SAT solving time is found to be non-negligible. Note also that the comparative gain from using incremental SAT techniques in the SAT solver is less than that from using the customized translations. This indicates the benefits of the incremental formulations as a partitioning strategy, even when the constraint sharing is not exploited by the SAT solver.

7. Proofs by Induction for Safety Properties

Apart from finding bounded-length counterexamples, a BMC engine can also be used for performing proofs by induction <16>. Induction with increasing depth k, and restriction to loop-free paths, provides a complete proof technique for safety properties <5, 11>. Induction with depth k consists of the following two steps:

Base case: to prove that the property holds on every k-length path starting from the initial state.
Inductive step: to prove that if the property holds on a k-length path starting from any state, then it also holds on all its extensions to a (k+1)-length path.

The restriction to loop-free paths imposes the additional constraints that no two states in the paths are identical. Note that the base case includes use of the initial state constraint, but the inductive step does not. Therefore, the inductive step may include unreachable states also. In practice, this may not allow the induction proof to go through without the use of additional constraints, i.e. stronger induction invariants than the property itself. In particular, any circuit constraints known by the designers can be used to strengthen the induction invariants, including reachability constraints.

a) BMC Procedure for Proof by Induction

The induction procedure used in the BMC engine is discussed herein. Appendix 3 is an example pseudo-code.

Here, p denotes the monitor predicate corresponding to the safety property to be proved true, i.e. the correctness property is G(p). Given an arbitrary safety property expressed in LTL, a monitor predicate can be obtained by using tableaux construction techniques <1>, such that the safety property is true if and only if the monitor predicate is true in every reachable state. In the shown pseudo-code, c denotes any circuit constraints known to be true; I denotes the initial state constraint, and R denotes the reachability constraint. Note that the example proof procedure discussed herein assumes both c and R to hold, i.e. $c\_i$ must be true in every time frame, and R must be an over-approximation of the reachable states. (If unavailable, each can be regarded as "true" in the pseudo-code.)

In the pseudo-code, BC is the clause database for performing the base case checks, and IC is the clause database for performing the inductive step check. The procedure is started by initializing (lines 3, 4). The first SAT check (line 5) is performed to see if any state which satisfies c and R also satisfies !p. If no such state exists, clearly the property p is true—this provides an early termination case without even starting a proof by induction. The loop on i (lines 7-18) performs a proof by induction with increasing depth, up to the user-specified limit N. First, the base case is checked by adding the constraint $c\_i$, and checking for the satisfiability of $!p\_i$ in the $i^{th}$ time frame. If it is satisfiable, a counterexample starting from the initial state has been found, and the property is false (lines 10, 11). However, if this is not satisfiable, then $p\_i$ is learned and added to the BC database (line 12). Next, the inductive step for the $(i+1)^{th}$ time frame is checked. It is assumed that $p\_i$ is true according to the inductive hypothesis (line 13), constraint $c\_i+1$ is also added (line 14), and the satisfiability of $!p\_i+1$ is checked (line 16) along with the restriction that the (i+1)-length path is loop-free. If this is not satisfiable, then the proof by induction has succeeded, and the property is indeed true. However, if it is satisfiable, then the proof has failed at depth i, and we try the loop again by incrementing i. If the limit N is reached, then the result is inconclusive.

Rather than generate a monolithic SAT formula for each of the base case and inductive steps for depth i, the procedure builds the SAT subproblems incrementally, while learning from unsatisfiable SAT instances. Due to these enhancements, the disclosed BMC engine is effective at performing such proofs in practice, as demonstrated by the experimental results on several industrial strength designs. These results are shown in Table 5 (shown in FIG. 10), for experiments performed on a Sun UltraSparc 440 MHz, 1 GB workstation.

Proofs by induction were performed for designs (Column 1) and safety properties (Column 2) for which the BMC engine was unable to find a counterexample. For these proofs, circuit constraints provided by the designers were used, but no reachability constraints were used. Column 3 reports the number of flip-flops (#FF) and gates (#G) in the cone of influence of the property. Column 4 reports the verification status, where "T" indicates that the property was proved to be true, while "-" indicates that the induction proof was inconclusive. Note that the BMC engine was able to prove 23 of the 33 properties to be true. In Column 5 we report the depth up to which the proof by induction was carried out. All successful proofs were found in depth less than 2. On the other hand, the inconclusive proofs did not succeed up to depth 25 for many properties. Finally, Columns 6 and 7 report the time (in seconds) and the memory (in Mbytes) required to conduct the proof. Note that these requirements are very modest, even for depth 25.

The next section describes an attempt to find effective reachability invariants and use them for proofs by induction.

8. Combining BMC and BDDs

In this section, a novel framework for combining BDDs and SAT-based BMC is presented. Indeed the main idea is quite general—to use any external information about state sets, computed as BDDs, to constrain the search in BMC. As a practical issue, since BDD manipulation tends to be resource intensive (both in time and memory), the BDDs are converted to either circuit or CNF form, which can then be handled as circuit/CNF constraints by the BMC engine.

The use of this framework for proofs by induction is as follows. The first task is to obtain an over-approximation of the set of reachable states. This can be done in various ways. For example, an "existential" abstraction of the design can be performed by abstracting away some latches as pseudo-primary inputs. Good candidates for such abstraction are peripheral latches that do not contribute to the sequential core, or latches that are farther in the dependency closure of the property signals etc. Essentially, the abstract design should contain a superset of the paths in the real design. Therefore, a BDD-based symbolic traversal can be used to obtain an over-approximate set of reachable states. Instead of exact traversal on the abstract design, approximate traversal techniques can also be used <28, 29>. In addition, over-approximation techniques for BDDs can be used to further reduce the size of the final BDD <30>.

Once an over-approximate set of reachable states is obtained as a BDD (or a set of BDDs), the task is to convert it to a form suitable for the BMC engine. At this time, a BDD is converted to a circuit/CNF form, where each internal BDD node is regarded as a multiplexor controlled by the BDD variable (in this case, a "state" variable). This derived circuit/CNF is added as a reachability constraint to the BMC engine, to be used in the induction proof procedure described herein in pseudo-code form.

Practical instances have been found where the use of a BDD-based reachability constraint enabled an induction proof to go through, whereas the proof without this constraint did not succeed. The experimental results are shown in Table 6 (shown in FIG. 11). Again, the experiments were performed on a Sun UltraSparc 440 MHz, 1 GB workstation. Here, Columns 3 through 6 report the results for BDD-based reachability analysis on the abstract design, while Columns 7 through 11 report the results for the BMC-based proof by induction on the full design. For these experiments, the abstract designs were obtained automatically from the unconstrained designs, by abstracting away latches farther in the dependency closure of the property signals. This took less than a minute in each case. Column 3 reports the number of flip-flops (#FF) and gates (#G) in the abstract design. Note that these numbers are much smaller than the corresponding numbers in the full design (Column 7). Column 4 reports the time taken (in seconds) for the symbolic traversal of the abstract design including its conversion to circuit form. The number of iterations required for symbolic traversal is reported in Column 5, and the final size of the BDD (after further over-approximation in some cases) is reported in Column 6. For the BMC induction proof, Columns 8 and 9 report the verification status and depth of induction, respectively. Note that in each case the proof went through very easily. Finally, Columns 10 and 11 report the time and memory used by the BMC engine.

The important point to note from these results is that despite gross approximations in the BDD-based analysis, in order to keep the BDD time and size requirements quite low, the reachability constraints obtained were strong enough to let the induction proof go through with BMC. Though neither the BDDs, nor the BMC engine, could individually prove these safety properties, their combination with our framework allowed the proof to be completed in less than 20 seconds!

The main motivation for working with the combined framework is that the capabilities of a SAT-based BMC engine are inherently path-based, while BDD-based symbolic analysis is inherently set-based. Therefore, BDDs can be used to complement the capabilities of a pure BMC engine wherever possible. Another line of application for this framework is to find counterexamples/witnesses for arbitrary CTL properties. By performing BDD-based approximate model checking on abstractions of a given design, BDD-based representations of a "witness graph" can be obtained <18>. These sets can then be used to constrain or prioritize the search for counterexamples in the BMC engine.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

```
1    /* N = Max depth
2       f_i = property node at i^th time-frame
3       L_ij = Loop constraint between the i^th
4          and j^th time frames
5       &(|) = cnf conjunction(disjunction) */
6
7    F(p){
8       F(1,p,0);
9    }
10
11   F(IC,p,start){
12      C = IC;
13      for(i=start;i<N;i++) {
14         if (is_sat(C & p_i)) return true;
15         C = C & !p_i;
16         for(j=i;j>=start;j--) { //optional 16-21
17            C = C & !L_ij;
18            // optional 19
19            // if(!is_sat(C))return false;
20         }
21         if (!is_sat(C)) return false;
22      }
23   }
24
25   G(p){
30      C = 1;
31      for (i=0;i<N;i++) {
32         C = C & p_i;
33         if (!is_sat(C)) return false;
34         for(j=i;j>=0;j--) {
35            if (is_sat(C & L_ij)) return true;
36            C = C & !L_ij;
37         }
38         if (!is_sat(C)) return false;
39      }
40   }
41
42   G(IC,p,start){
43      C = IC; t = 0; C" = 1;
44      for (i=start;i<N;i++) {
45         C = C & p_i;
46         if (!is_sat(C)) return false;
47         for(j=i;j>=start;j--) {
```

```
 48       if (is_sat(C & L__ij)) return true;
 49       C = C & !L__ij;
 50     }
 51     C' = C & C'';
 52     for(j=start-1;j>=t;j--) {
 53       if (!is_sat(C' & p__j)) {
 54         t = j+1; C'' = C'' & !p__j; break; }
 55       C' = C' & p__j;
 56       if (is_sat(C'& L__ij)) return true;
 57       C' = C' & !L__ij;
 58     }
 59     for(l=start-1;l>j;l--)
 60       C = C & !L__il;
 61     if (!is_sat(C)) return false;
 62   }
 63 }
 64
 65 F(p or F(q)) {
 66   C = 1;
 67   for(i=0;i<N;i++) {
 68     if (is_sat(C & p__i)) return true;
 69     C = C & !p__i;
 70
 71     if (F(C,q,i)) return true;
 72
 73     for(j=i;j>=0;j--) {
 74       C = C & !L__ij;
 75       //if (!is_sat(C)) return false;
 76     }
 77     // reached the bound
 78     if (!is_sat(C)) return false;
 79   }
 80 }
 81
 82 F(p and F(q)){
 83   C = 1;
 84   for(i=0;i<N;i++) {
 85     if (!is_sat(C & p__i)) {
 86       C = C & !p__i;
 87     } else {
 88       if (F(C & p__i,q,i)) return true;
 89
 90       for(j=i;j>=0;j--) {
 91         C = C & !L__ij;
 92         //if (!is_sat(C)) return false;
 93       }
 94       // reached the bound
 95       if (!is_sat(C)) return false;
 96     }
 97 }
 98
 99 F(p or G(q)){
100   C = 1;
101   for(i=0;i<N;i++) {
102     if (is_sat(C & p__i)) return true;
103     C = C & !p__i;
104
105     if (G(C,q,i)) return true;
106
107     for(j=i;j>=0;j--) {
108       C = C & !L__ij;
109       //if (!is_sat(C)) return false;
110     }
111     // reached the bound
112     if (is_sat(C)) return false;
113   }
114 }
115
116 F(p and G(q)){
117   C = 1;
118   for(i=0;i<N;i++) {
119     if (!is_sat(C & p__i)) {
120       C = C & !p__i;
121     } else {
122       if (G(C & p__i,q,i)) return true;
123     }
124     for(j=i;j>=0;j--) {
125       C = C & !L__ij;
126       //if (!is_sat(C)) return false;
127     }
128     // reached the bound
129     if (!is_sat(C)) return false;
130   }
131 }
132
133 U(IC,q,r,start) {
134   C = IC;
135   for(i=start;i<N;i++) {
136     if (is_sat(C & r__i)) return true;
137     C = C & !r__i & q;
138     if (!is_sat(C)) return false;
139     for(j=i;j>=0;j--) {
140       C = C & !L__ji;
141       //if (!is_sat(C)) return false;
142     }
143     // reached the bound
144     if (!is_sat(C)) return false;
145   }
146 }
147
148 F(p and U(q,r)) {
149   C = 1;
150   for(i=0;i<N;i++) {
151     if (!is_sat(C & p__)) {
152       C = C & !p__i;
153     } else {
154       if (U(C & p__i, q, r,i)) return true;
155
156       for(j=i;j>=0;j--) {
157         C = C & !L__ji;
158         //if (!is_sat(C)) return false;
159       }
160       // reached the bound
161       if (!is_sat(C)) return false;
162     }
163 }
164
165 F(p or U(q,r)) {
166   C = 1;
167   for(i=0;i<N;i++) {
168     if (is_sat(C & p__i)) return true;
169     C = C & !p__i;
170     if (U(C, q, r,i)) return true;
171     for(j=i;j>=0;j--) {
172       C = C & !L__ji;
173       //if (!is_sat(C)) return false;
174     }
175     // reached the bound
176     if (!is_sat(C)) return false;
177   }
178 }
```

```
 1  EF(p and ! EX:n q){
 2    C = 1; C' = 0;
 3    for (i=0;i<N;i++) {
 4      if (!is_sat(C & p__i)) {
 5        C = C & !p__i;
 6      } else {
 7        if (!is_sat(C & p__i & q__{n+i}))
 8          return true;
 9        else {
10          // exclude states with p & q_{n+i}
11          while(1) {
12            C' = C'| get_sat_state_cube(i);
13            if (!is_sat(C& !C'& p__i))
14              break; // no more p__i states
15            if (!is_sat(C& !C'& p__i & q__{n+i}))
16              return true; // found witness
```

```
-continued
17        } // end of while loop
18      }
19    }
20    for(j=i;j>=0;j--) {
21      C = C & !L_ij;
22      //if (!is_sat(C)) return false;
23    }
24    if (!is_sat(C)) return false;
25  }
26 }
27
28 EF(p or ! EX:n q){
29   C = 1;
30   for (i=0;i<N;i++) {
31     if (is_sat(C & p_i)) return true;
32     else {
33       C = C & !p_i;
34       if (!is_sat(C & q_{n+i})) return true;
35       else {
36         // exclude states with q_{n+i}
37         while(1) {
38           C' = C'| get_sat_state_cube(i);
39           if (!is_sat(C& !C')
40             break; // no more states
41           if (!is_sat(C& !C'& q_{n+i}))
42             return true; // found witness
43         } // end of while loop
44       }
45     }
46     for(j=i;j>=0;j--) {
47       C = C & !L_ij;
48       //if (!is_sat(C)) return false;
49     }
50     if (!is_sat(C)) return false;
51   }
52 }
```

```
/* p_i, c_i: property node p, constraint node c
   at $i^{th}$ time frame,
   starting from unconstrained state
   I: initial state constraint
   R: Reachability constraint,
     e.g. over-approximate reachable set */
1  bmc_induction_proof(p,c,R,I)
2  {
3    BC = I;
4    IC = R & c_0;
5    if (!is_sat(IC & !p_0)
6      return true;
7    for (i = 0; i < N; i++){
8      BC = BC & c_i;
9      // Base case: if sat, counterexample
10     if (is_sat(BC & !p_i))
11        return false;
12     BC = BC & p_i;
13     IC = IC & p_i;
14     IC = IC & c_i+1;
15     // Inductive step: if unsat, found proof
16     if (!is_sat(IC&loop_free(0,i+1)& !p_i+1))
17        return true;
18   }
19   return inconclusive;
20 }
```

What is claimed is:

1. A method for bounded model checking of arbitrary Linear Temporal Logic (LTL) properties in a verification engine for verification circuits which is capable of bounded model checking the method comprising:

in a verification engine, translating by a computer configured by said verification engine LTL properties expressed with one or more LTL operators F(p), G(p), U(p,q) and X(p) into property checking schemas for performing Boolean satisfiability checks, wherein F represents an eventuality operator, G represents a globally operator, U represents an until operator, X represents a next-time operator, p represents either an atomic proposition or a Boolean combination of LTL operators, and q represents either an atomic proposition or a Boolean combination of LTL operators, checking by the said computer the said properties by invoking repeatedly one or more property checking schemas for F(p), G(p), U(p,q) and X(p) operators, and using the results of the checking to indicate if a circuit performs according to the said properties, wherein a subset of the property checking schemas is customized to perform a partitioning of a $k^{th}$ instance of a corresponding bounded model checking problem into multiple smaller Boolean satisfiability sub-problems, wherein the partitioning is performed across said LTL operators, and for each said operator both across time frames and within time frames, wherein when a choice exists about which said operator to check next, the choice is made according to priority determined by degree of difficulty of search estimated to be increasing in the following order: atomic propositions, X operator, F operator, U operator, G operator.

2. The method of claim 1 wherein an incremental formulation of a Boolean satisfiability algorithm is used to solve the said Boolean sub-problems.

3. The method of claim 1 wherein circuit simplification based on constant propagation is further used to simplify the said Boolean satisfiability sub-problems.

4. The method of claim 1 wherein circuit simplification based on detection of structural isomorphism is further used to simplify the Boolean satisfiability sub-problems.

5. The method of claim 1 wherein the said Boolean satisfiability sub-problems are solved by using a hybrid Boolean Satisfiability (SAT) solver that combines circuit-based and Conjunctive Normal Form—based (CNF-based) satisfiability checking techniques.

6. The method of claim 1 wherein the property checking schema for the said LTL operator F(p) for a given time frame bound comprises:

a) starting search from a given start state at time frame i, with a given constraint database, wherein i=0 corresponds to an initial state of the circuit;

b) checking for satisfiability of p in the $i^{th}$ state of a path, c) if satisfiable, terminating the search with success;

d) if unsatisfiable, learning that p is always false in the $i^{th}$ state and adding this learnt knowledge to a constraint database;

e) continuing the search by increasing i until the said time frame bound is reached, and repeating steps b-d; and f) terminating the search inconclusively if the said time frame bound is reached.

7. The method of claim 6 further comprising checking for completeness of the solution between steps d and e, to determine failure wherein, failure characterizes that the said success in step c is not achievable for any time frame i.

8. The method of claim 7 wherein the checking for completeness further comprises:

(i) adding constraints to ensure that same states are not revisited in the said path, and checking satisfiability of the constraint database;

(ii) if unsatisfiable, terminating the search with the said failure, (iii) otherwise, continuing search; and (iv) repeating steps (i)-(iii) until all previous states have been examined.

9. The method of claim 6, wherein a subset of satisfiability checks is combined into a single satisfiability check.

10. The method in claim 1 wherein the property checking schema for the said LTL operator G(p) for a given time frame bound comprises:
   a) starting search from a given start state at time frame i with a given constraint database, wherein i=0 corresponds to an initial state of the circuit,
   b) adding a constraint to the database to ensure that p is satisfied in the $i^{th}$ state of a path, and checking for satisfiability,
   c) if unsatisfiable, terminating the search with failure,
   d) if satisfiable, checking for each $j^{th}$ state from the start state to $i^{th}$ state whether it is a loopback state and terminating the search with success if a loopback state is found;
   e) checking for each $j^{th}$ state before the start state whether it is a loopback state and terminating the search with success if a loopback state is found;
   f) continuing the search by increasing i until the said time frame bound is reached and repeating steps a-e;
   g) terminating the search inconclusively if the said time frame bound is reached.

11. The method of claim 10 wherein step d is performed by:
   (di) checking satisfiability of a transition from the $i^{th}$ state to the $j^{th}$ state,
   (dii) if the transition of step di is satisfiable, terminating the search with success,
   (diii) if the transition of step di unsatisfiable, learning that such a transition does not exist and adding this knowledge to the constraint database,
   (div) continuing the search by repeating (di)-(diii) until all states from the said start state to the $i^{th}$ state have been examined.

12. The method of claim 10 wherein step e is performed by:
   (ei) checking for satisfiability of p at each state from the $j^{th}$ state up to a start state,
   (eii) if unsatisfiable in step ei, quitting Step e and moving to Step f,
   (eiii) if satisfiable in step ei, checking satisfiability of a transition from the $i^{th}$ state to the $j^{th}$ state,
   (eiv) if the said transition of step eiii is satisfiable, terminating the search with success,
   (ev) if the said transition of step eiii is unsatisfiable, continuing the search by repeating Steps ei-eiv until all states from the initial state of the circuit up to the start state have been examined.

13. The method of claim 10 further comprising checking for completeness of a solution between steps e and f, to determine failure wherein, failure characterizes that success in step e is not achievable for any time frame i.

14. The method of claim 13 wherein the checking for completeness further comprises:
   (i) adding constraints to ensure that same states are not revisited in the said path, and checking satisfiability of the constraint database,
   (ii) if unsatisfiable in step i, terminating the search with the said failure,
   (iii) if satisfiable in step i, continuing search; and
   (iv) repeating steps i-iii until all previous states have been examined.

15. The method of claim 10, wherein a subset of satisfiability checks is combined into a single satisfiability check.

16. The method in claim 1 wherein the property checking schema for the said LTL operator U(p, q) for a given time frame bound comprises:
   a) starting search from a given start state at time frame i with a given constraint database, wherein i=0 corresponds to an initial state;
   b) checking for satisfiability of q in the $i^{th}$ state of a path,
   c) if satisfiable, terminating the search with success;
   d) if unsatisfiable, learning that q is always false in the $i^{th}$ state and adding this knowledge to the constraint database;
   e) adding the constraint to the database to ensure that p is satisfied in the $i^{th}$ state, and checking for satisfiability;
   f) if unsatisfiable in step e, terminating the search with failure;
   g) if satisfiable in step e, continuing the search;
   h) continuing the search by increasing i until the said time frame bound is reached and repeating steps b-g; and
   i) terminating the search inconclusively if the said time frame bound is reached.

17. The method of claim 16 further comprising checking for completeness of the solution between steps g and h, to determine failure, wherein failure characterizes that the success in step c is not achievable for any time frame i.

18. The method of claim 17, wherein the checking for completeness further comprises:
   (i) adding constraints to ensure that same states are not revisited in the said path, and checking satisfiability of the constraint database;
   (ii) if unsatisfiable in step i, terminating the search with the said failure;
   (iii) if satisfiable in step i, continuing search; and
   (iv) repeating steps i-iii until all previous states have been examined.

19. The method of claim 16, wherein a subset of satisfiability checks is combined into a single satisfiability check.

20. The method in claim 1 wherein the property checking schema for the said LTL operator X(p) comprises:
   a) starting search from a start state at time frame i with a given constraint database, where i=0 corresponds to an initial state of the circuit;
   b) checking for satisfiability of p in the next state, wherein next state characterizes the state reachable next from the initial state,
   c) terminating with success if p is found true in the next state, d) terminating with failure if p is found false in the next state,
   e) terminating inconclusively if check for p is inconclusive in the next state.

21. The method of claim 20, wherein a subset of satisfiability checks is combined into a single satisfiability check.

* * * * *